US011222800B2

(12) United States Patent
Matsutori

(10) Patent No.: US 11,222,800 B2
(45) Date of Patent: Jan. 11, 2022

(54) SUBSTRATE STORAGE CONTAINER

(71) Applicant: MIRAIAL CO., LTD., Tokyo (JP)

(72) Inventor: Chiaki Matsutori, Tokyo (JP)

(73) Assignee: MTRAIAL CO., LTD., Tokyo (JP)

(*) Notice: Subject to any disclaimer, the term of this patent is extended or adjusted under 35 U.S.C. 154(b) by 0 days.

(21) Appl. No.: 16/637,665

(22) PCT Filed: Aug. 9, 2017

(86) PCT No.: PCT/JP2017/028950
§ 371 (c)(1),
(2) Date: Feb. 7, 2020

(87) PCT Pub. No.: WO2019/030863
PCT Pub. Date: Feb. 14, 2019

(65) Prior Publication Data
US 2020/0258765 A1 Aug. 13, 2020

(51) Int. Cl.
H01L 21/673 (2006.01)

(52) U.S. Cl.
CPC .. H01L 21/67369 (2013.01); H01L 21/67383 (2013.01)

(58) Field of Classification Search
CPC ......... H01L 21/67373; H01L 21/67369; H01L 21/37383; H01L 21/393; H01L 21/67303; H01L 21/6732
USPC .................. 206/710–712, 454, 455, 832
See application file for complete search history.

(56) References Cited

U.S. PATENT DOCUMENTS

| 4,061,228 | A | * | 12/1977 | Johnson | B65D 25/107 206/454 |
| 5,706,946 | A | * | 1/1998 | Kakizaki | B65D 25/107 206/454 |
| 5,960,960 | A | * | 10/1999 | Yamamoto | H01L 21/67326 206/454 |
| 6,206,197 | B1 | * | 3/2001 | Decamps | H01L 21/6732 206/454 |
| 7,344,031 | B2 | * | 3/2008 | Hasegawa | H01L 21/67369 206/710 |
| 7,967,147 | B2 | * | 6/2011 | Mimura | H01L 21/67369 206/711 |
| 8,910,792 | B2 | * | 12/2014 | Nagashima | H01L 21/67383 206/711 |

(Continued)

FOREIGN PATENT DOCUMENTS

| JP | 2014116492 A | 6/2014 |
| JP | 2016072369 A | 5/2016 |

(Continued)

Primary Examiner — Chun Hoi Cheung
(74) Attorney, Agent, or Firm — Muncy, Geissler, Olds & Lowe, P.C.

(57) ABSTRACT

A substrate storing container provided with a container main body, a lid body, a lateral substrate support portion, a lid body side substrate support portion, and a back side substrate support portion includes a casting-off portion that casts off a substrate in a state being supported by the back side substrate support portion and the lid body side substrate support portion from at least one of the back side substrate support portion or the lid body side substrate support portion. When the lid body is opened from the container main body opening portion from a state in which the container main body opening portion is closed by the lid body.

3 Claims, 18 Drawing Sheets

(56) References Cited

U.S. PATENT DOCUMENTS

| | | | |
|---|---|---|---|
| 2003/0221985 A1* | 12/2003 | Yajima | H01L 21/67369 |
| | | | 206/454 |
| 2009/0230019 A1* | 9/2009 | Yang | C30B 25/12 |
| | | | 206/711 |
| 2011/0062052 A1* | 3/2011 | Ku | H01L 21/67383 |
| | | | 206/711 |
| 2013/0056388 A1 | 3/2013 | Nagashima | |
| 2014/0238896 A1* | 8/2014 | Huang | H01L 21/67383 |
| | | | 206/711 |
| 2017/0294327 A1* | 10/2017 | Gregerson | H01L 21/67369 |
| 2017/0294328 A1 | 10/2017 | Honsho et al. | |

FOREIGN PATENT DOCUMENTS

| | | |
|---|---|---|
| JP | 2016127206 A | 7/2016 |
| JP | 2019127206 A | 7/2016 |
| WO | WO2011148450 A1 | 12/2011 |

* cited by examiner

FIG. 4
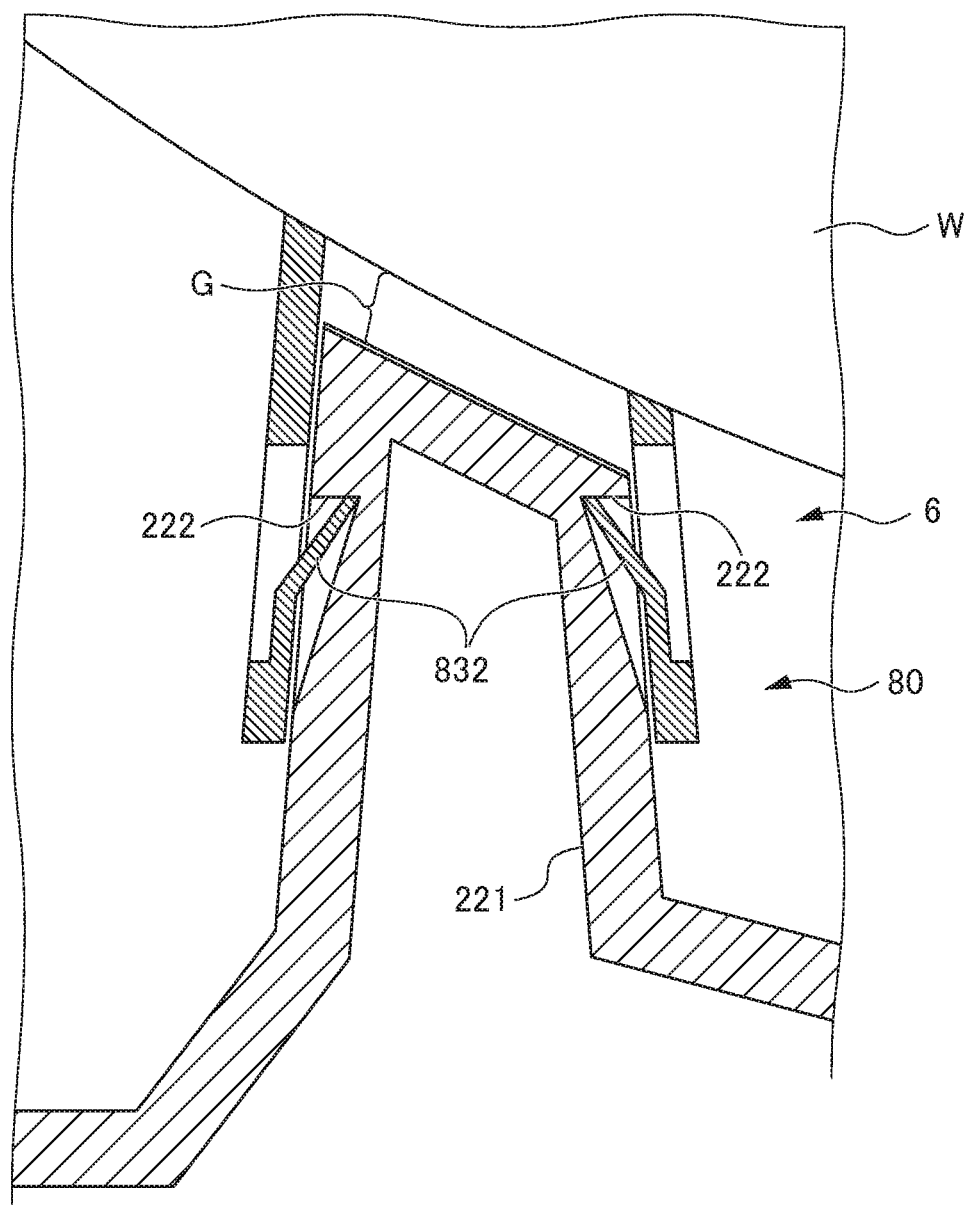
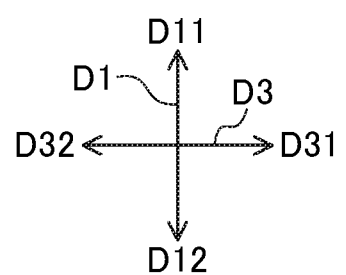

FIG. 5
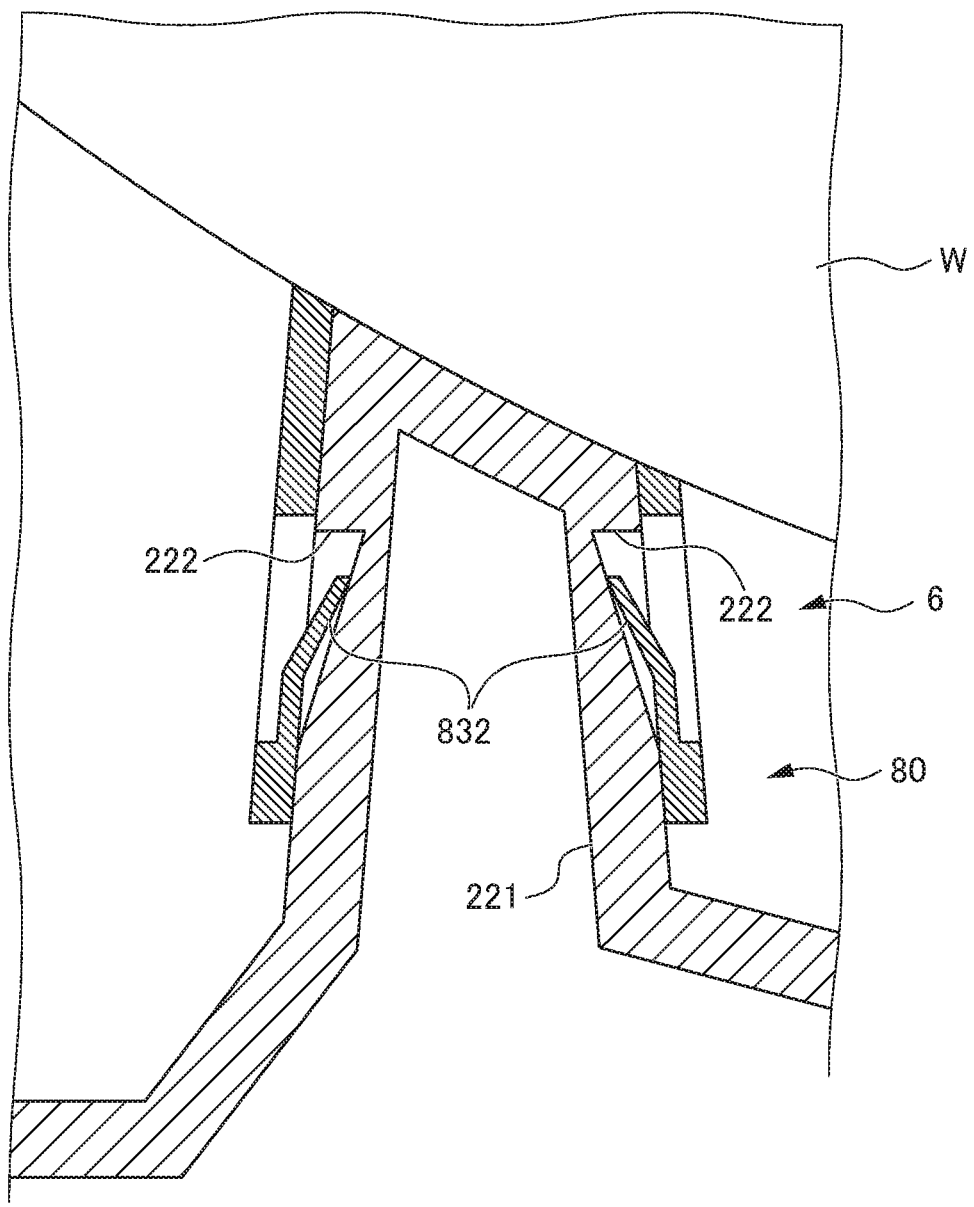
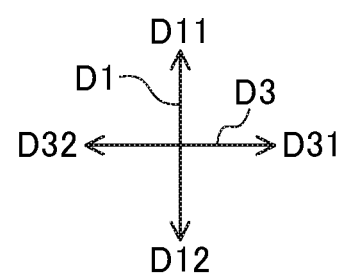

FIG. 14
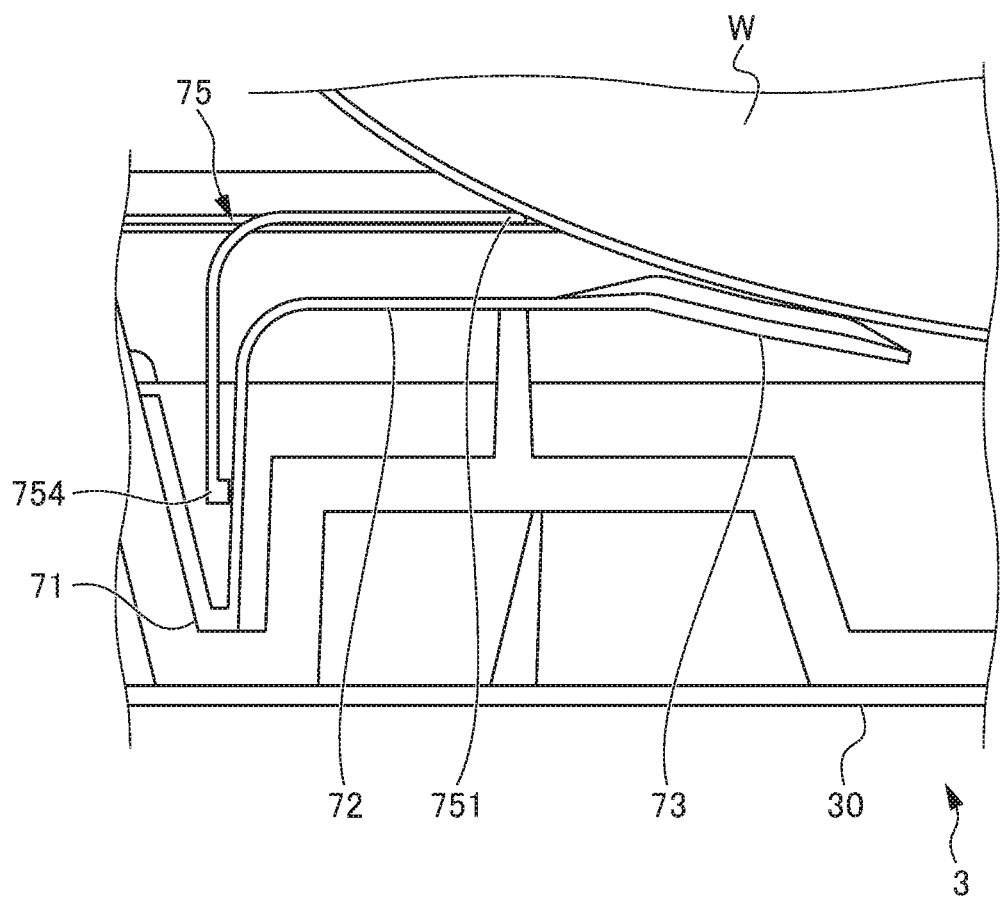
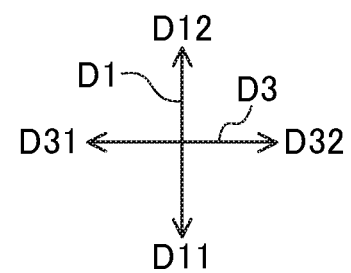

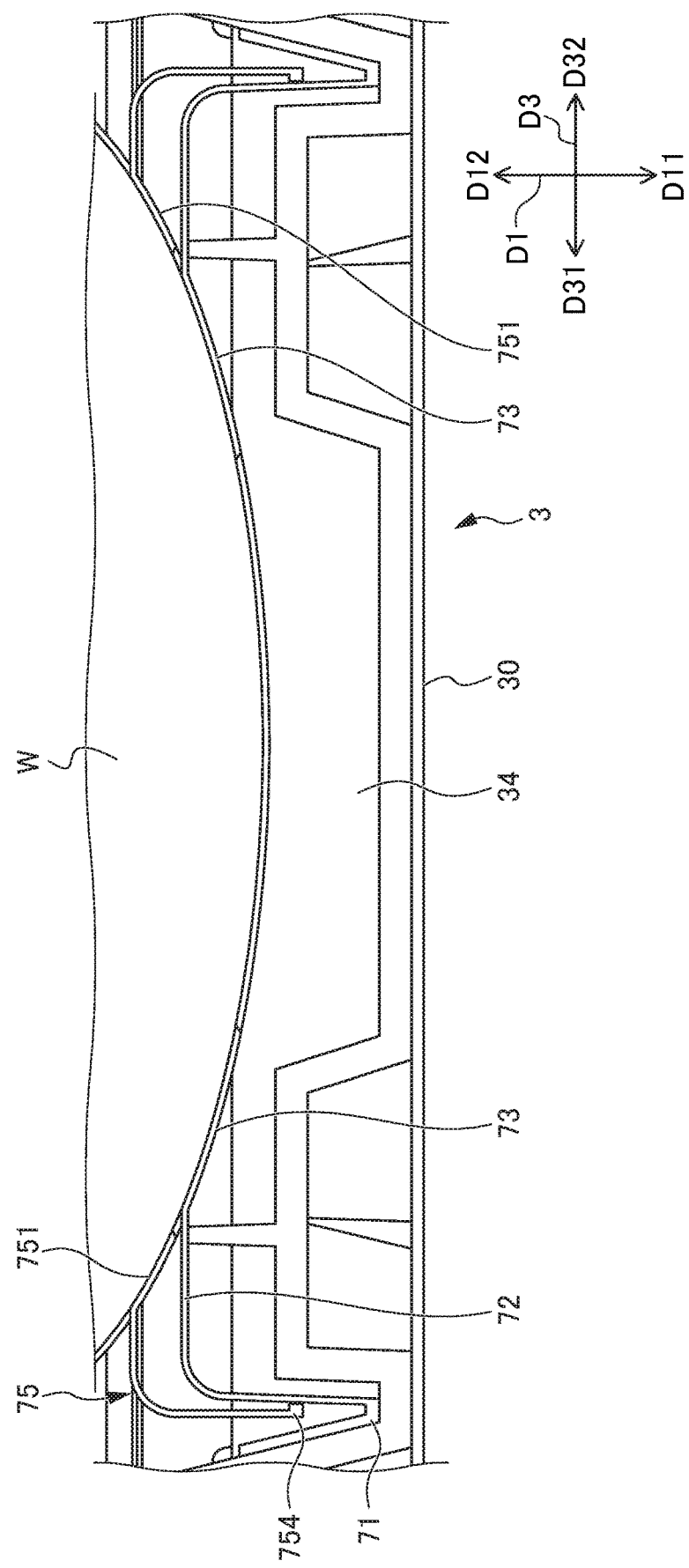

SUBSTRATE STORAGE CONTAINER

TECHNICAL FIELD

The present invention relates to a substrate storing container used, for example, when housing, storing, delivering, and transporting a substrate made from a semiconductor wafer, for example.

BACKGROUND ART

As a substrate storing container for storing and delivering a substrate made from a semiconductor wafer, a substrate storing container has been conventionally known that has a configuration including a container main body and a lid body.

One end of the container main body has an opening circumferential portion at which a container main body opening portion is formed. The other end of the container main body has a closed tubular wall portion. A substrate storage space is formed in the container main body. The substrate storage space is formed by being surrounded by the wall portion, and can store a plurality of substrates. The lid body is attachable to and detachable from the opening circumferential portion (for example, refer to Patent Document 1).

A front retainer is provided at a portion of the lid body which faces the substrate storage space while the container main body opening portion is closed. While the container main body opening portion is closed by the lid body, the front retainer can support the edges of the plurality of substrates. Furthermore, a back side substrate support portion is provided at the wall portion so as to form a pair with the front retainer. The back side substrate support portion can support the edges of the plurality of substrates. While the container main body opening portion is closed by the lid body, the back side substrate support portion cooperates with the front retainer to support the plurality of substrates, thereby supporting the plurality of substrates in a state in which the adjacent substrates are spaced apart by a predetermined interval and are arranged in parallel with each other.

Patent Document 1: Japanese Unexamined Patent Application, Publication No. 2014-116492

DISCLOSURE OF THE INVENTION

Problems to be Solved by the Invention

In a substrate storing container, while a container main body opening portion is closed by a lid body and substrates are accommodated in a substrate storage space (when storing substrates), the substrates are sandwiched by a back side substrate support portion and a front retainer cooperating with each other as mentioned above, and thus supported and fixed to the substrate storing container. This suppresses damage to the substrates and the rotation of the substrates.

However, in a case in which the static friction coefficient of the back side substrate support portion or the front retainer is low, even when the substrates are fixed by being sandwiched with strong force, it is likely that contaminants will deposit on clean substrates due to the generation of particles caused by the vibration, etc., during the transportation of the substrate storing container. On the contrary, in a case in which the static friction coefficient of the back side substrate support portion or the front retainer is high, it is possible to securely support the substrates. Therefore, less contaminants are deposited. However, in a case in which the static friction coefficient of the back side substrate support portion or the front retainer is high as described above, when the substrates slide with respect to the back side substrate support portion and the front retainer, and thus move while taking the substrates out, the substrates will not slide smoothly with respect to the back side substrate support portion or the front retainer, and thus, it is difficult to move all of the substrates to a predetermined location for taking the substrates out at which the substrates can be supported by a predetermined device. As a result, since the location of the moved substrates is not constant, it is difficult to take the substrates out from the substrate storing container by using a predetermined device.

It is an object of the present invention to provide a substrate storing container that allows a substrate, when taking the substrate out from the substrate storing container, to slide smoothly with respect to a back side substrate support portion and a front retainer, to move to a predetermined location, and to be taken out from the substrate storing container.

Means for Solving the Problems

The present invention relates to a substrate storing container including: a container main body including an opening circumferential portion at one end thereof where a container main body opening portion is formed, and including a tubular wall portion having another end thereof which is closed, in which a substrate storage space is formed which can store a plurality of substrates by an inner face of the wall portion, and is in communication with the container main body opening portion; a lid body that is attachable to and detachable from the container main body opening portion and can close the container main body opening portion; a lateral substrate support portion that is provided to form a pair in the substrate storage space and, while the container main body opening portion is not closed by the lid body, can support edge portions of the plurality of substrates in a state in which adjacent substrates among the plurality of substrates are spaced apart by a predetermined interval and arranged in parallel to each other; a lid body side substrate support portion that, while the container main body opening portion is closed by the lid body, is disposed at a portion of the lid body that faces the substrate storage space and can support the edge portions of the plurality of substrates; a back side substrate support portion that is provided to form a pair with the lid body side substrate support portion in the substrate storage space and can support the edge portions of the plurality of substrates and, while the container main body opening portion is closed by the lid body, cooperates with the lid body side substrate support portion to be able to support the plurality of substrates; and a casting-off portion that casts off the substrate in a state being supported by the back side substrate support portion and the lid body side substrate support portion from at least one of the back side substrate support portion or the lid body side substrate support portion, when the lid body is opened from the container main body opening portion from a state in which the container main body opening portion is closed by the lid body.

Furthermore, it is preferable that the casting-off portion casts off the substrate in a state being supported by the back side substrate support portion from the back side substrate support portion, and a maximum static friction coefficient of a portion of the casting-off portion that abuts the substrate when the container main body opening portion is closed or opened by the lid body is smaller than a maximum static friction coefficient of a portion of the back side substrate support portion that abuts the substrate.

Furthermore, it is preferable that the casting-off portion casts off the substrate in a state being supported by the lid body side substrate support portion from the lid body side substrate support portion, and a maximum static friction coefficient of a portion of the casting-off portion that abuts the substrate when the container main body opening portion is closed or opened by the lid body is smaller than a maximum static friction coefficient of a portion of the lid body side substrate support portion that abuts the substrate.

Furthermore, it is preferable that the casting-off portion includes an elastic member that elastically deforms, and casts off the substrate by an elastic force of the elastic member.

Effects of the Invention

According to the present invention, it is possible to provide a substrate storing container that allows a substrate, when taking the substrate out from the substrate storing container, to slide smoothly with respect to a back side substrate support portion and a front retainer, to move to a predetermined location, and to be taken out from the substrate storing container.

BRIEF DESCRIPTION OF THE DRAWINGS

FIG. 4 is an enlarged cross-sectional view of a state in which the casting-off portion 83 starts to abut the substrate W, in the container main body 2 of the substrate storing container 1 according to the first embodiment of the present invention;

FIG. 5 is an enlarged cross-sectional view of a state of the casting-off portion 83 in the container main body 2 when a container main body opening portion 21 is closed by a lid body 3, in the substrate storing container 1 according to the first embodiment of the present invention;

FIG. 14 is an enlarged cross-sectional view of a state in which the casting-off portion 75 starts to abut the substrate W, in the lid body 3 of the substrate storing container 1 according to the first embodiment of the present invention;

FIG. 15 is an enlarged cross-sectional view of a state of the casting-off portion 75 in the lid body 3 when the container main body opening portion 21 is closed by the lid body 3, in the substrate storing container 1 according to the first embodiment of the present invention;

PREFERRED MODE FOR CARRYING OUT THE INVENTION

Figure 1:
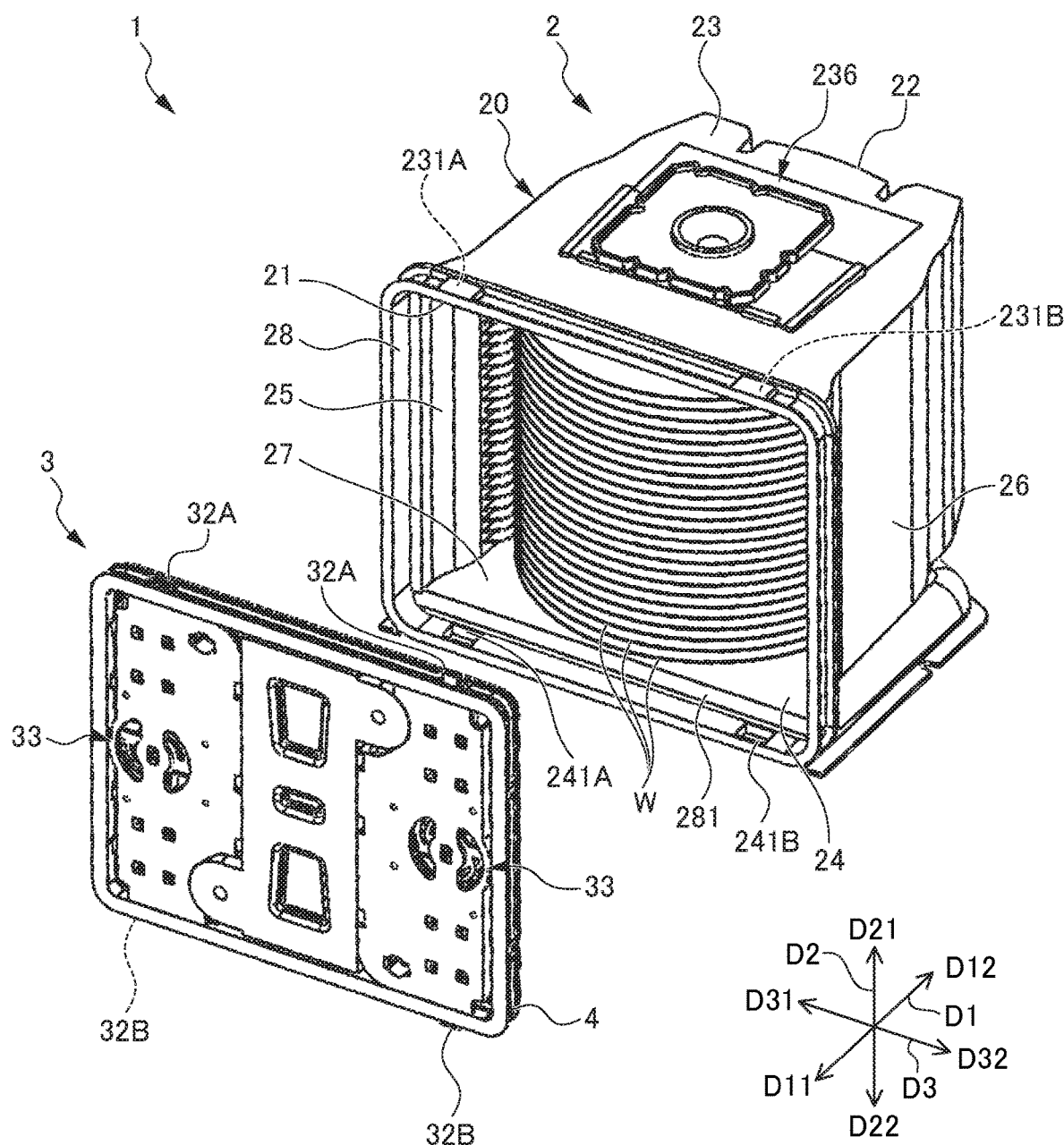
FIG. 1 is an exploded perspective view of a state in which a plurality of substrates W is stored in a substrate storing container 1 according to a first embodiment of the present invention.
Figure 2:
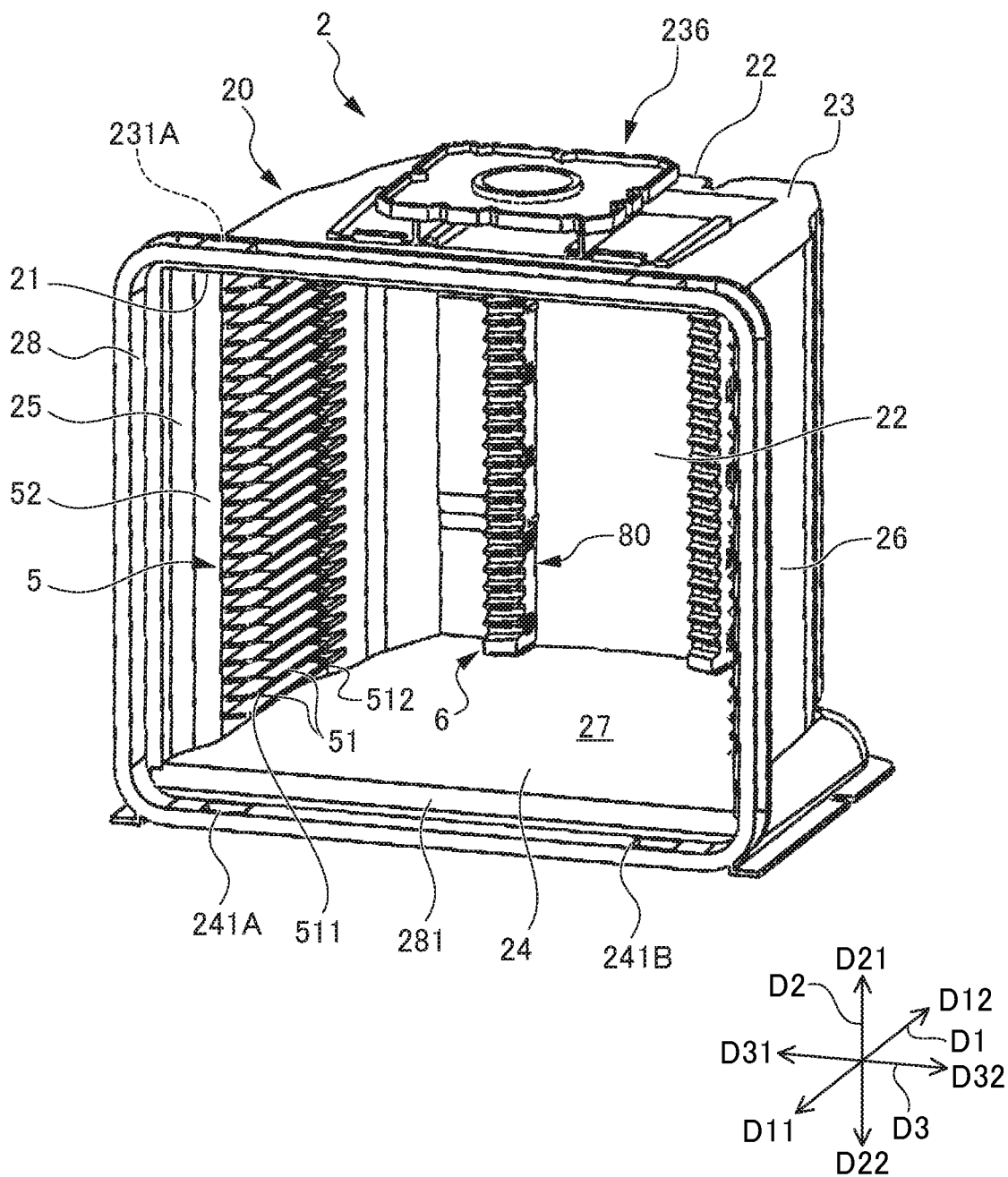
FIG. 2 is a perspective view of a container main body 2 of the substrate storing container 1 according to the first embodiment of the present invention.

In the following, a substrate storing container 1 according to a first embodiment will be described with reference to the drawings. FIG. 1 is an exploded perspective view of a state in which a plurality of substrates W is stored in a substrate storing container 1 according to a first embodiment of the present invention. FIG. 2 is a perspective view of a container main body 2 of the substrate storing container 1 according to the first embodiment of the present invention.

Herein, for the convenience of explanation, the direction from the container main body 2 toward the lid body 3 (the direction from upper right to lower left in FIG. 1) is defined as a forward direction D11, and the opposite direction to the direction D11 is defined as a backward direction D12. These directions are defined as a forward-backward direction D1. Furthermore, the direction from a lower wall 24 to an upper wall 23 described later (upper direction in FIG. 1) is defined as an upper direction D21, and the direction opposite to the direction D21 is defined as a lower direction D22. In addition, these directions are defined as an upper-lower direction D2. Furthermore, the direction from a second side wall 26 toward a first side wall 25 (described later) (the direction from lower right to upper left in FIG. 1) is defined as a left direction D31, and the direction opposite to the direction D31 is defined as a right direction D32. These directions are defined as a left-right direction D3. Arrows indicating these directions are illustrated in the main drawings.

Furthermore, the substrates W (refer to FIG. 1) stored in the substrate storing container 1 are each a disk-like silicon wafer, glass wafer, sapphire wafer, etc., and are each a thin member used in industry. The substrates W according to the present embodiment are each a silicon wafer having a diameter of 300 mm.

As illustrated in FIG. 1, the substrate storing container 1 is used as a shipping container that stores the substrates W each made of a silicon wafer as described above, and transports the substrates W by transportation such as land transportation, air transportation, and marine transportation. The substrate storing container 1 includes a container main body 2 and a lid body 3. The container main body 2 includes a substrate support plate-like portion 5 (refer to FIG. 2, etc.) as a lateral substrate support portion and a back side substrate support portion 6 (refer to FIG. 2 etc.). The lid body 3 includes a front retainer 7 as a lid body side substrate support portion (refer to FIG. 7, etc.).

As illustrated in FIG. 1, etc., the container main body 2 has a tubular wall portion 20 with a container main body opening portion 21 formed at one end and the other end closed. A substrate storage space 27 is formed in the container main body 2. The substrate storage space 27 is formed to be surrounded by the wall portion 20. The substrate support plate-like portion 5 is arranged at a part that is a part of the wall portion 20 forming the substrate storage space 27, as illustrated in FIG. 2. As illustrated in FIG. 1, a plurality of substrates W can be stored in the substrate storage space 27.

The substrate support plate-like portion 5 is provided at the wall portion 20 so as to form a pair in the substrate storage space 27. When the container main body opening portion 21 is not closed by the lid body 3, the substrate support plate-like portion 5 abuts an edge portion of each of the plurality of substrates W, thereby making it possible to support the plurality of substrates W in a state in which adjacent substrates W are spaced apart by a predetermined interval and arranged in parallel to each other. The back side substrate support portion 6 is provided at the back side of the substrate support plate-like portion 5.

The back side substrate support portion 6 (refer to FIG. 2, etc.) is provided at the wall portion 20 so as to form a pair with a front retainer 7 (refer to FIG. 7, etc.) within the substrate storage space 27. When the container main body opening portion 21 is closed by the lid body 3, the back side substrate support portion 6 abuts the edge portion of each of the plurality of substrates W, thereby making it possible to support rear portions of the edge portions of the plurality of substrates W.

The lid body 3 is attachable to and detachable from an opening circumferential portion 28 (FIG. 1, etc.) that forms the container main body opening portion 21. The lid body 3 is able to open and close the container main body opening portion 21. The front retainer 7 is a part of the lid body 3 and provided at a part facing a portion which faces the substrate storage space 27, when the container main body opening portion 21 is closed by the lid body 3. The front retainer 7 is arranged so as to form a pair with the back side substrate support portion 6 in the interior of the substrate storage space 27.

When the container main body opening portion 21 is closed by the lid body 3, the front retainer 7 abuts the edge portion of each of the plurality of substrates W, thereby making it possible to support front portions of the edge portions of the plurality of substrates W. When the container main body opening portion 21 is closed by the lid body 3, the front retainer 7 supports the plurality of substrates W in cooperation with the back side substrate support portion 6, thereby retaining the plurality of substrates W in a state in which adjacent substrates W are spaced apart by a predetermined interval and arranged in parallel to each other.

The substrate storing container 1 is configured from a resin such as a plastic material and, unless explanations are particularly provided, examples of the resin of the plastic material include thermoplastic resins such as polycarbonate, cycloolefin polymer, polyether imide, polyether ketone, polybutylene terephthalate, polyether ether ketone, and liquid crystal polymer, alloys thereof, and the like. In a case of imparting conductivity to the resin of these molding materials, conductive materials such as carbon fiber, carbon powder, carbon nanotubes, and conductive polymer are selectively added. Furthermore, it is possible to add glass fiber, carbon fiber, and the like to enhance the rigidity.

In the following, each component will be described in detail. As illustrated in FIG. 1, the wall portion 20 of the container main body 2 includes a back wall 22, an upper wall 23, a lower wall 24, a first side wall 25, and a second side wall 26. The back wall 22, the upper wall 23, the lower wall 24, the first side wall 25, and the second side wall 26 are configured from the abovementioned material and are configured to be integrally molded.

The first side wall 25 faces the second side wall 26. The upper wall 23 faces the lower wall 24. A rear end of the upper wall 23, a rear end of the lower wall 24, a rear end of the first side wall 25, and a rear end of the second side wall 26 are each connected to the back wall 22. A front end of the upper wall 23, a front end of the lower wall 24, a front end of the first side wall 25, and a front end of the second side wall 26 have a positional relationship facing the back wall 22, and configure the opening circumferential portion 28 that forms the container main body opening portion 21 having a substantially rectangular shape.

The opening circumferential portion 28 is provided at one end of the container main body 2. The back wall 22 is located at the other end of the container main body 2. The profile of the container main body 2 formed by the outer faces of the wall portion 20 is a box shape. Inner faces of the wall portion 20, i.e. an inner face of the back wall 22, an inner face of the upper wall 23, an inner face of the lower wall 24, an inner face of the first side wall 25, and an inner face of the second side wall 26 form the substrate storage space 27 surrounded by them. The container main body opening portion 21 formed by the opening circumferential portion 28 is in communication with the substrate storage space 27 that is surrounded by the wall portion 20 and formed inside the container main body 2. The substrate storage space 27 can store a maximum of twenty-five of the substrates W.

As illustrated in FIG. 1, latch engaging recessed portions 231A, 231B, 241A, and 241B are formed at portions of the upper wall 23 and the lower wall 24 which are portions in the proximity of the opening circumferential portion 28. The latch engaging recessed portions 231A, 231B, 241A, and 241B are indented outwardly of the substrate storage space 27. The latch engaging recessed portions 231A, 231B, 241A, and 241B are respectively formed, one by one, in the vicinity of both left and right ends of the upper wall 23 and the lower wall 24. The total amount thereof is four.

As illustrated in FIG. 1, a top flange 236 is fixed at a middle portion of the upper wall 23. The top flange 236 is a member corresponding to a portion of the substrate storing container 1 from which it is hung to be suspended, when suspending the substrate storing container 1 by AMHS (Automated Material Handling System), PGV (Person Guided Vehicle), etc.

The substrate support plate-like portion 5 is an interior component that is provided at each of the first side wall 25 and the second side wall 26, and provided within the substrate storage space 27 so as to form a pair in the left-right direction D3. More specifically, as illustrated in FIG. 2, etc., for example, the substrate support plate-like portion 5 includes a plate portion 51 and a support wall 52. The plate portion 51 is supported by the support wall 52.

The plate portion 51 has a substantially plate-like arc shape. Twenty-five of the plate portions 51 are respectively provided at the first side wall 25 and the second side wall 26 in the upper-lower direction D2. The total number of the plate portions 51 is fifty. The adjacent plate portions 51 are arranged so as to be spaced apart in the upper-lower direction D2 at an interval of 10 mm to 12 mm in a parallel positional relationship. It should be noted that a plate-like member in parallel with the plate portion 51 is further arranged above the plate portion 51 that is located at the top. The plate-like member serves as a guide upon inserting for the substrate W that is located at the top to be inserted into the substrate storage space 27.

Furthermore, the twenty-five plate portions 51 provided at the first side wall 25 and the twenty-five plate portions 51 provided at the second side wall 26 have a positional relationship opposite each other in the left-right direction D3. Furthermore, the fifty plate portions 51 and the plate-like member, which is in parallel with the plate portions 51 and serves as a guide, have a positional relationship parallel to the inner face of the lower wall 24. As illustrated in FIG. 2, etc., protruding portions 511 and 512 are provided at an upper face of the plate portion 51. The substrate W supported by the plate portion 51 is only in contact with projecting ends of the protruding portions 511 and 512, and does not contact with the face of the plate portion 51.

The support wall 52 has a plate-like shape extending in the upper-lower direction D2 and a substantially forward-backward direction D1. The support wall 52 has a predetermined length in a longitudinal direction of the plate portion 51, and is connected to a side end edge of the plate portion 51. The plate-like support wall 52 is curved toward the substrate storage space 27 along an outer side end edge of the plate portion 51.

In other words, the twenty-five plate portions 51 provided at the first side wall 25 are connected to the support wall 52 provided close to the first side wall 25. Similarly, the twenty-five plate portions 51 provided at the second side wall 26 are connected to the support wall 52 provided close to the second side wall 26. The support wall 52 is fixed to each of the first side wall 25 and the second side wall 26.

With the substrate support plate-like portion 5 of such a configuration, it is possible to support the edge portions of the plurality of substrates W in a state in which the adjacent substrates W among the plurality of substrates W are arranged to be spaced apart at a predetermined interval in a parallel positional relationship.

Figure 6:
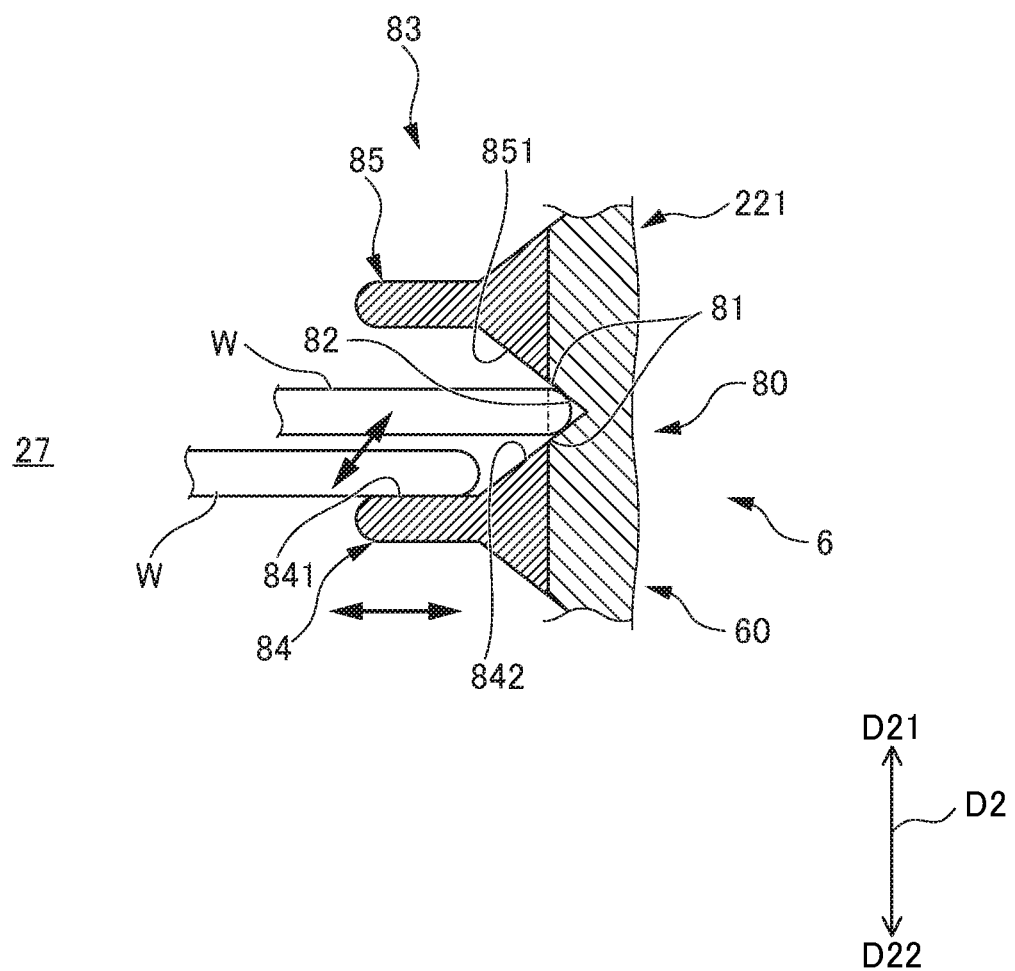
FIG. 6 is a schematic diagram illustrating a positional relationship of the substrate W with respect to a rear pressing portion 80 and the casting-off portion 83, when the container main body opening portion 21 is opened and closed by the lid body 3 in the substrate storing container according to the first embodiment of the present invention.

As illustrated in FIG. 2, etc., the back side substrate support portion 6 includes a rear pressing portion 80. The rear pressing portion 80 is provided to be formed at a rib-like portion 221 (refer to FIG. 3, etc.) provided on the back wall 22. The rib-like portion 221 projects inwards in the substrate storage space 27 on the inner face of the back wall 22. The rear pressing portion 80 is formed on the inner face of the rib-like portion 221 that projects inwards in the substrate storage space 27 and, as illustrated in FIG. 6, includes a recessed portion forming portion 81 at which a recessed portion 82 is formed at a predetermined interval in the upper-lower direction D2. The edge portion of the substrate W can be engaged with the recessed portion 82. FIG. 6 is a schematic diagram illustrating a positional relationship of the substrate W with respect to the rear pressing portion 80 and the casting-off portion 83, when the container main body opening portion 21 is opened and closed by the lid body 3, in the substrate storing container according to the first embodiment of the present invention.

Figure 3:
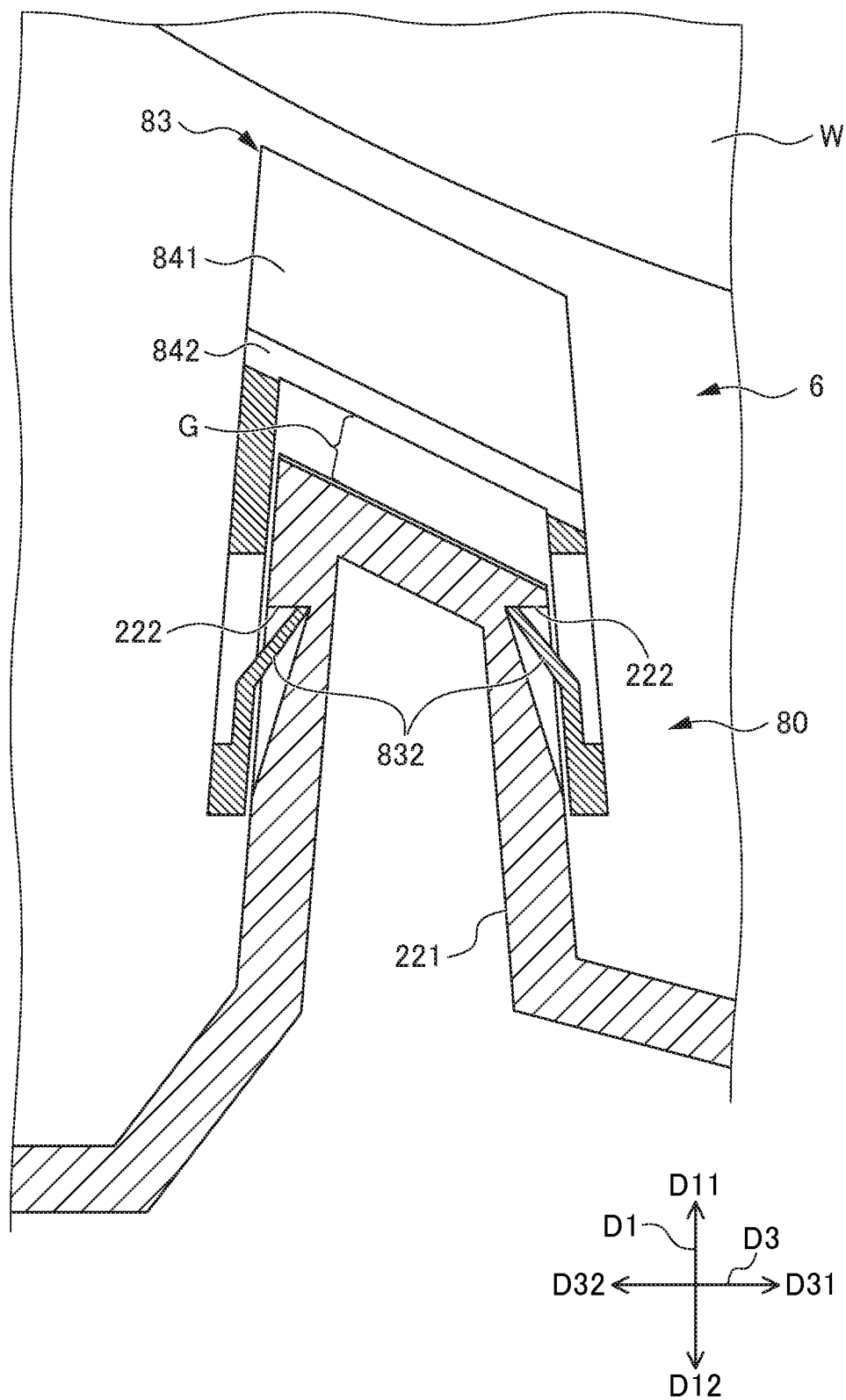
FIG. 3 is an enlarged cross-sectional view of a state in which a casting-off portion 83 does not abut the substrate W and thus is away from the substrate W, in the container main body 2 of the substrate storing container 1 according to the first embodiment of the present invention.

As illustrated in FIG. 3, etc., a pair of elastic portion engaged-recessed portions 222 is formed on a side face of an inner face (a face on the inside of the container main body 2) of the rib-like portion 221. The elastic portion engaged-recessed portion 222 is formed to become deeper (become wider in the left-right direction D3) as advancing in the forward direction D11, and a front end of the elastic portion engaged-recessed portion 222 ends at a predetermined location from a front end of the rib-like portion 221 towards the backward direction D12. FIG. 3 is an enlarged cross-sectional view of a state in which the casting-off portion 83 does not abut the substrate W, and thus is away from the substrate W, in the container main body 2 of the substrate storing container 1 according to the first embodiment of the present invention. FIG. 4 is an enlarged cross-sectional view of a state in which the casting-off portion 83 starts to abut the substrate W, in the container main body 2 of the substrate storing container 1 according to the first embodiment of the present invention. FIG. 5 is an enlarged cross-sectional view of a state of the casting-off portion 83 in the container main body 2, when the container main body opening portion 21 is closed by the lid body 3, in the substrate storing container 1 according to the first embodiment of the present invention.

Furthermore, the casting-off portion 83 is provided so as to cover the rib-like portion 221. As illustrated in FIGS. 3 to 5, the casting-off portion 83 includes a substantially U-shaped casting-off portion main body 831 in a cross section in parallel with the forward-backward direction D1 and the left-right direction D3. A pair of plate spring portions 832 as elastic members that extend inside the substantially U-shape and are elastically deformed is provided at left and right side portions of the substantially U-shaped casting-off portion main body 831. The pair of the plate spring portions 832 extends obliquely in the forward direction D11 so as to come close to each other from a middle portion of the left and right side portions of the casting-off portion main body 831 in the forward-backward direction D1. The pair of the plate spring portions 832 is engaged with the elastic portion engaged-recessed portions 222, and slides with respect to the rib-like portion 221 in the forward-backward direction D1 at the elastic portion engaged-recessed portion 222. As described above, the elastic portion engaged-recessed portion 222 is formed to become deep as advancing in the forward direction D11. Therefore, the casting-off portion main body 831 is biased so as to move in the forward direction D11 by way of an elastic force that the plate spring portion 832 is supposed to go deeper into the elastic portion engaged-recessed portion 222.

Furthermore, as illustrated in FIG. 6, the casting-off portion 83 is located on a front side of the rib-like portion 221 in a cross section in parallel with the upper-lower direction D2. The casting-off portion 83 includes a support portion lower side portion 84 having a lower side abutting face 841 and a lower side inclined face 842, and a support portion upper portion 85 having an upper side inclined face 851.

More specifically, while the container main body opening portion 21 is not closed by the lid body 3, the lower side abutting face 841 abuts an end edge of a back face of the substrate W and supports the substrate W. The lower side inclined face 842 is configured by an inclined face that extends in an inclined manner from an end of the lower side abutting face 841 so as to be spaced apart from the center of the substrate storage space 27 (the left side in FIG. 6) as advancing in the upper direction D21, and the end of the back face of the substrate W slides thereon. The recessed portion forming portion 81 as described above constitutes a connecting portion that connects an inclined face of the lower side abutting face 841 and an inclined face of the upper side inclined face 851. In other words, an opening (a portion between the support portion lower side portion 84 and the support portion upper portion 85 in FIG. 6) in which the recessed portion 82 of the recessed portion forming portion 81 is in communication with the substrate storage space 27 is formed between the lower side abutting face 841 and the upper side inclined face 851, and an edge portion of the substrate W is engaged with the recessed portion 82 from the side of the substrate storage space 27 through the opening. The upper side inclined face 851 is configured by an inclined face that extends in an inclined manner from the recessed portion forming portion 81 so as to approach the center of the substrate storage space 27 (the left side in the FIG. 6) as advancing in the upper direction D21.

The lower side inclined face 842, the recessed portion 82, and the upper side inclined face 851 are provided on an upper side of the lower side abutting face 841 and, as illustrated in FIG. 6, form a V-shaped groove which is a dented recessed groove so as to be spaced apart from the center of the substrate storage space 27 with which the end of the substrate W can be engaged. The recessed portion 82 constitutes a portion of an apex of the V-shaped groove. While the container main body opening portion 21 is closed by the lid body 3, the substrate W slides on the lower side inclined face 842 to thereby be elevated, and when the substrate W reaches the location of the apex of the V-shaped groove, the end edge of the front face and the end edge of the back face of the substrate W abut the recessed portion forming portion 81, and the recessed portion forming portion 81 supports the edge portion of the substrate W at the recessed portion 82.

In order for any of the maximum static friction coefficients in a case in which the lower side abutting face 841, the lower side inclined face 842, or the upper side inclined face 851 is slid with respect to the substrate W to be relatively lower than the maximum static friction coefficient in a case in which the recessed portion forming portion 81 is slid with respect to the substrate W, the lower side inclined face 842, the lower side abutting face 841, the recessed portion forming portion 81, and the upper side inclined face 851 are subjected to surface processing such as surface roughening, as appropriate. More specifically, the maximum static friction coefficients in a case in which the lower side abutting face 841, the lower side inclined face 842, and the upper side inclined face 851 are slid with respect to the substrate W are 0.25 or less. The reason to set the value of the maximum static friction coefficient to be 0.25 or less is that, in a case of exceeding 0.25, the substrate W does not slide sufficiently with respect to the lower side abutting face 841, the lower side inclined face 842, and the upper side inclined face 851. Furthermore, the maximum static friction coefficient in a case in which the recessed portion forming portion 81 is slid with respect to the substrate W is 0.3 or more. The reason to set the value of the maximum static friction coefficient to be 0.3 or more is that, in a case of being 0.3 or less, it is likely that contaminants will deposit on clean substrates W due to the generation of particles caused by the vibration, etc., during the transportation of the substrate storing container 1.

Figure 7:
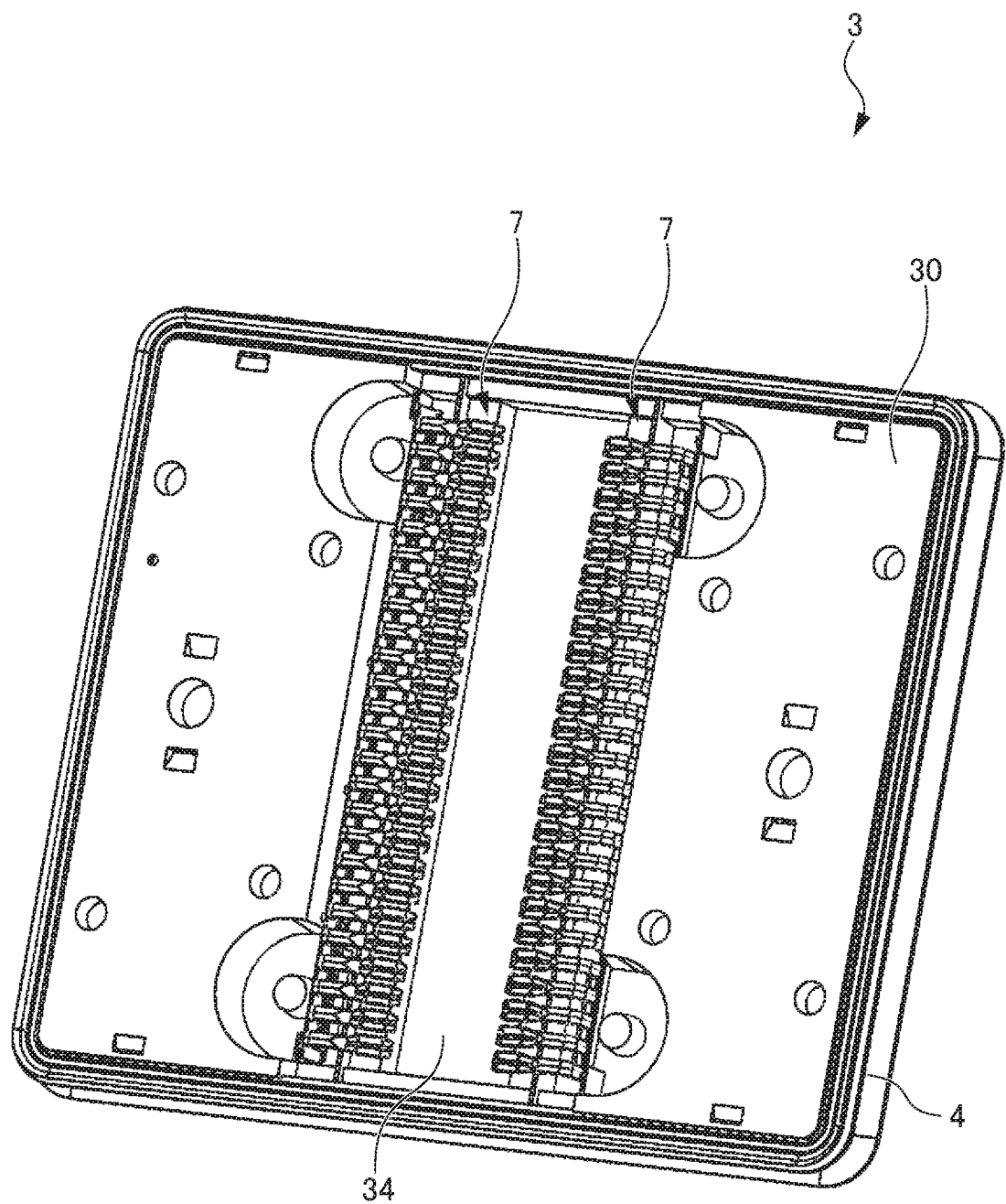
FIG. 7 is a perspective view illustrating the lid body 3 of the substrate storing container 1 according to the first embodiment of the present invention.
Figure 8:
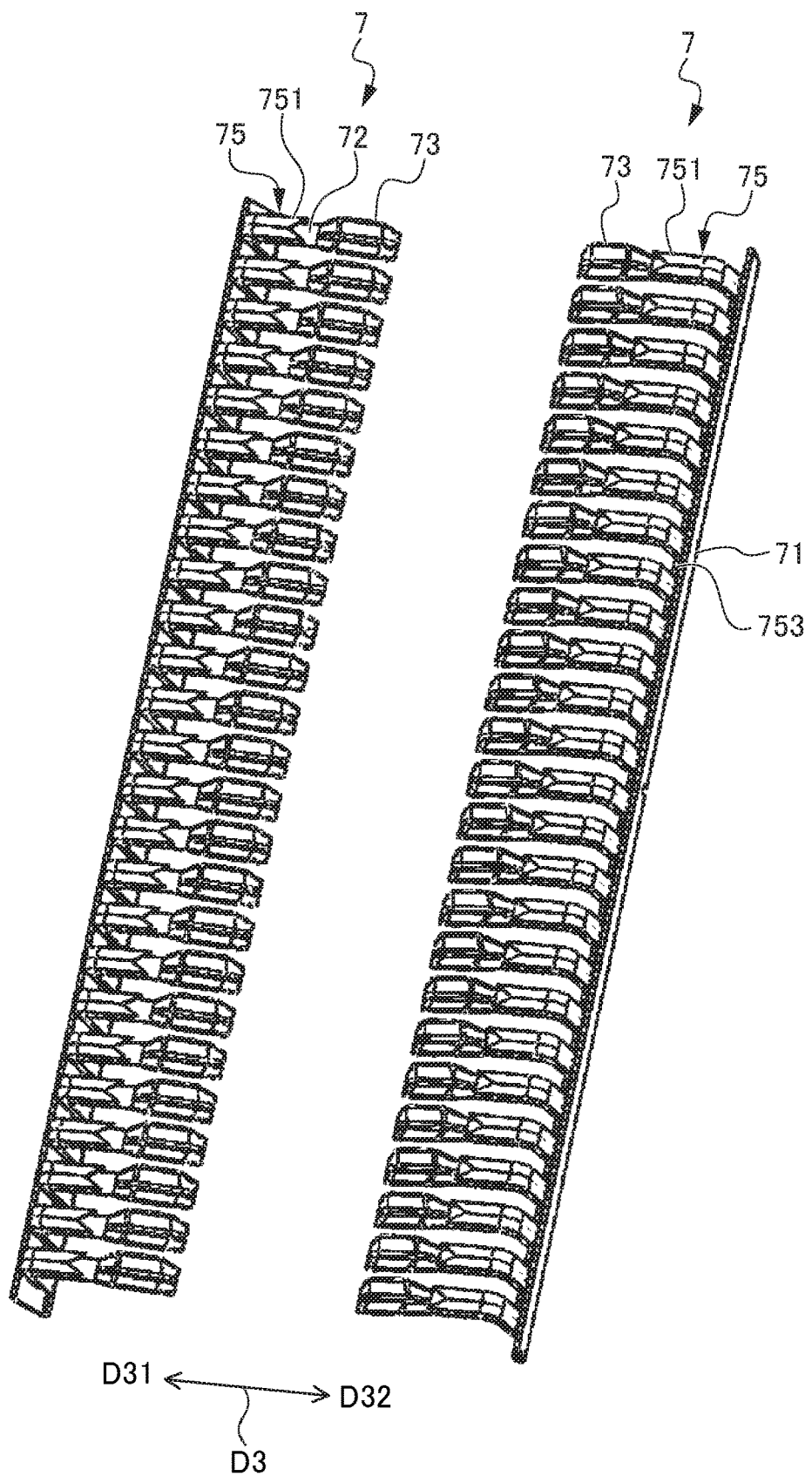
FIG. 8 is a perspective view illustrating a front retainer 7 and a casting-off portion 75 of the substrate storing container 1 according to the first embodiment of the present invention.
Figure 9:
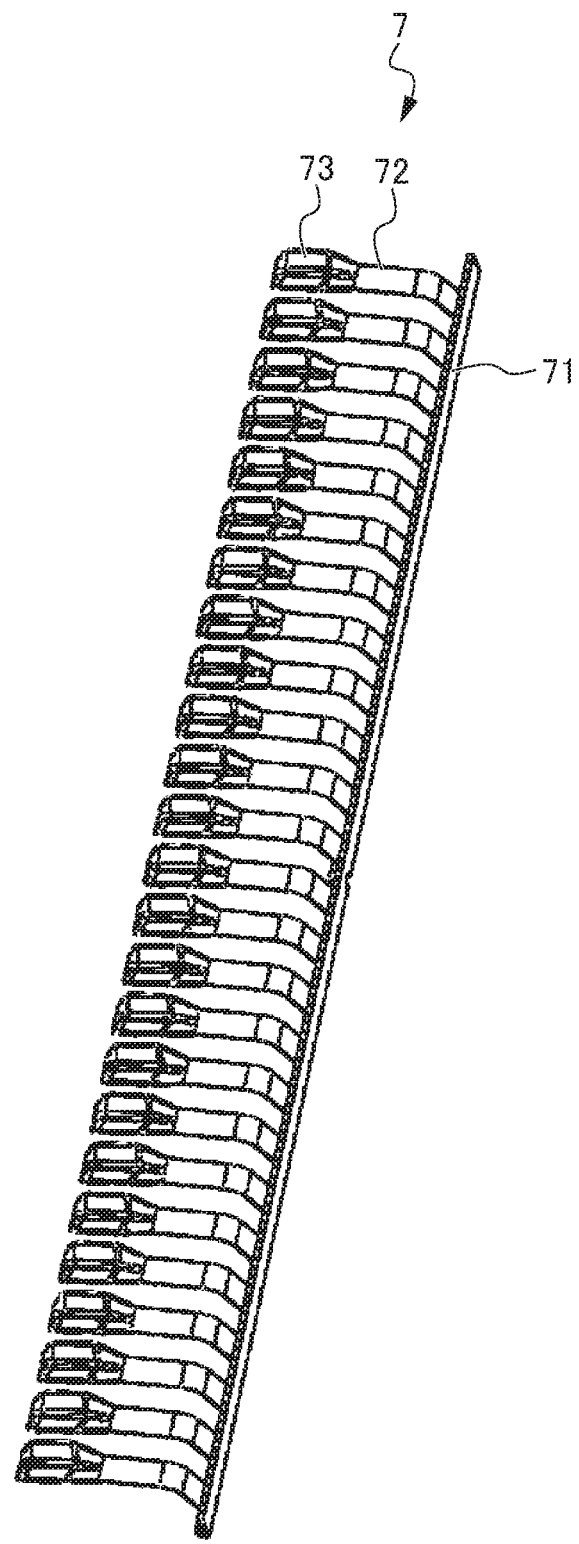
FIG. 9 is a perspective view illustrating the front retainer 7 of the substrate storing container 1 according to the first embodiment of the present invention.
Figure 10:
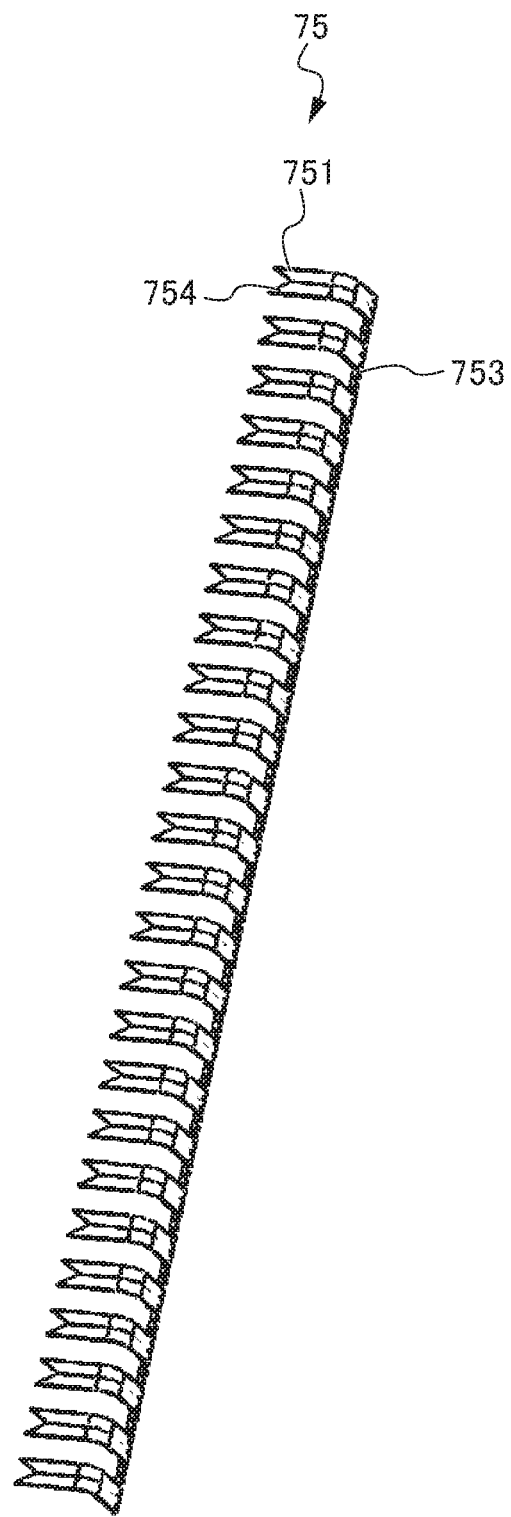
FIG. 10 is a perspective view illustrating the casting-off portion 75 of the lid body 3 of the substrate storing container 1 according to the first embodiment of the present invention.
Figure 11:
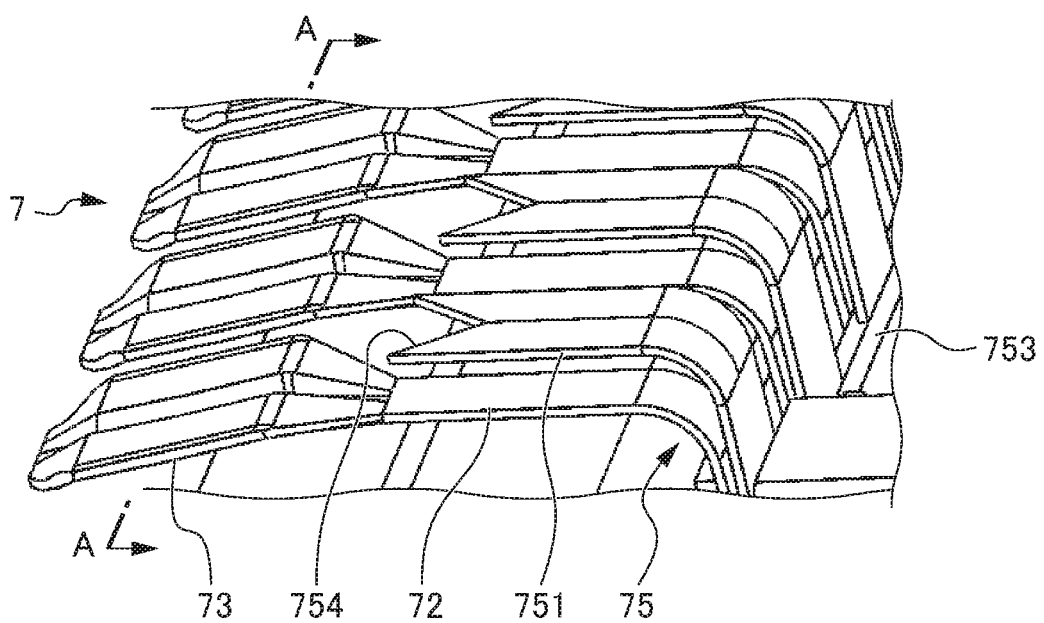
FIG. 11 is an enlarged perspective view of the front retainer 7 and the casting-off portion 75 of the substrate storing container 1 according to the first embodiment of the present invention.
Figure 12:
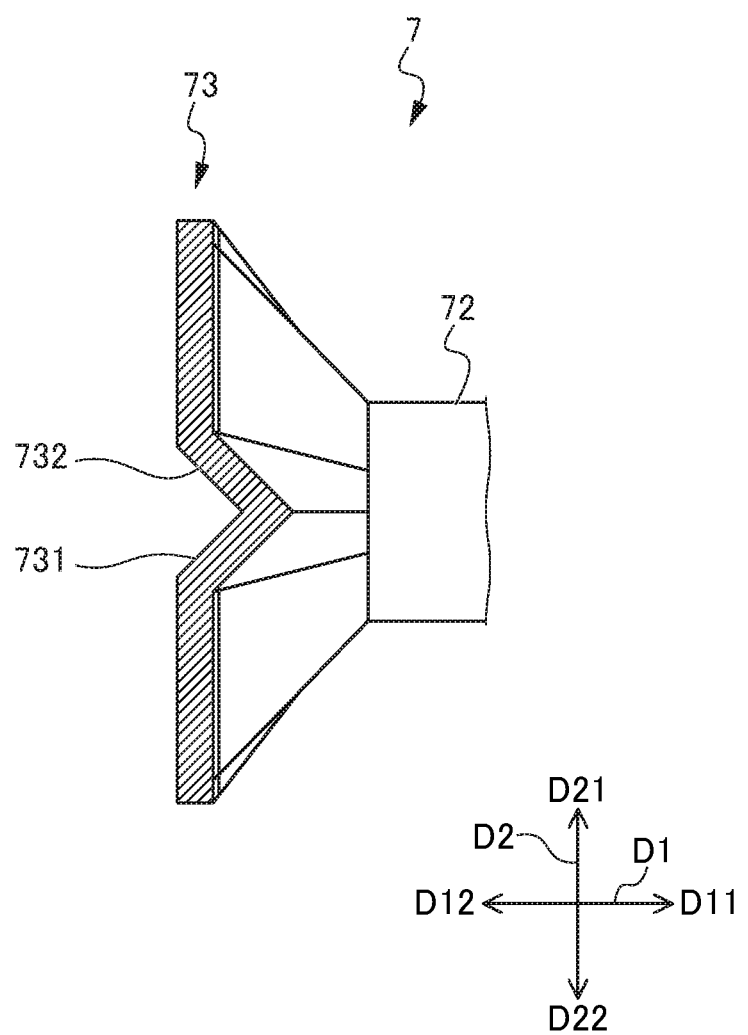
FIG. 12 is an enlarged cross-sectional view taken along the line A-A in FIG. 11.

Next, the lid body 3 and the front retainer 7 will be described in detail. FIG. 7 is a perspective view illustrating the lid body 3 of the substrate storing container 1 according to the first embodiment of the present invention. FIG. 8 is a perspective view illustrating the front retainer 7 and the casting-off portion 83 of the substrate storing container 1 according to the first embodiment of the present invention. FIG. 9 is a perspective view illustrating the front retainer 7 of the substrate storing container 1 according to the first embodiment of the present invention. FIG. 10 is a perspective view illustrating the casting-off portion 75 of the lid body 3 of the substrate storing container 1 according to the first embodiment of the present invention. FIG. 11 is an enlarged perspective view of the front retainer 7 and the casting-off portion 75 of the substrate storing container 1 according to the first embodiment of the present invention. FIG. 12 is an enlarged cross-sectional view taken along line A-A of FIG. 11.

As illustrated in FIG. 1, etc., the lid body 3 has a substantially rectangular shape which substantially matches the shape of the opening circumferential portion 28 of the container main body 2. The lid body 3 is removably attached to the opening circumferential portion 28 of the container main body 2. By the lid body 3 being attached to the opening circumferential portion 28, the lid body 3 can close the container main body opening portion 21. A ring-like sealing member 4 is attached to a face which is an inner face (a face on the back side of the lid body 3 illustrated in FIG. 1) of the lid body 3 and faces a face of a step portion (a sealing face 281) formed at a location of the opening circumferential portion 28 in the backward direction D12 when the lid body 3 closes the container main body opening portion 21. The sealing member 4 is made from various types of thermoplastic elastomers which are polyester based, polyolefin based, or the like and elastically deformable, fluorine containing rubber, silicon rubber, etc. The sealing member 4 is arranged so as to go around the circumferential edge portion of the lid body 3.

When the lid body 3 is attached to the opening circumferential portion 28, the sealing member 4 is caught by the sealing face 281 and the inner face of the lid body 3 to be elastically deformed, whereby the lid body 3 closes the container main body opening portion 21 in a sealed state. When the lid body 3 is removed from the opening circumferential portion 28, it is possible to load or unload the substrates W relative to the substrate storage space 27 in the container main body 2.

The lid body 3 includes a lid body main body 30 which forms a profile of the lid body 3. A latching mechanism is provided at the lid body main body 30. The latching mechanism is provided in the vicinity of both left and right end portions of the lid body main body 30. As illustrated in FIG. 1, the latching mechanism includes two upper side latch portions 32A which can project from the upper side of the lid body main body 30 in the upper direction D21, and two lower side latch portions 32B that can project from the lower side of the lid body main body 30 in the lower direction D22. The two upper side latch portions 32A are arranged in the vicinity of both left and right ends of the upper side of the lid body main body 30, and the two lower side latch portions 32B are arranged in the vicinity of both left and right ends of the lower side of the lid body main body 30.

A manipulating portion 33 is provided at an outer face of the lid body main body 30. By manipulating the manipulating portion 33 from the front side of the lid body main body 30, it is possible to cause the upper side latch portions 32A and the lower side latch portions 32B to respectively project from the upper side and the lower side of the lid body main body 30, as well as possible to establish a state not projecting from the upper side and the lower side of the lid body main body 30. By the upper side latch portions 32A projecting from the upper side of the lid body main body 30 in the upper direction D21 to engage with the latch engaging recessed portions 231A and 231B of the container main body 2 and the lower side latch portions 32B projecting from the lower side of the lid body main body 30 in the lower direction D22 to engage with the latch engaging recessed portions 241A and 241B of the container main body 2, the lid body 3 is fixed to the opening circumferential portion 28 of the container main body 2.

As illustrated in FIG. 7, on the inner side of the lid body main body 30 which constitutes the lid body 3, a recessed portion 34 that is indented outwardly of the substrate storage space 27 is formed. The front retainer 7 is provided to be fixed at a portion of the lid body main body 30 inside the recessed portion 34.

As illustrated in FIG. 8, etc., the front retainer 7 includes front retainer substrate receiving portions 73. The front retainer substrate receiving portions 73 are arranged so as to form pairs, each having two front retainer substrate receiving portions 73 that are spaced apart at a predetermined interval in the left-right direction D3. The front retainer substrate receiving portions 73 that are arranged so as to form the pairs, each having two front retainer substrate receiving portions 73, are provided in a state in which twenty-five pieces of the pairs are arranged in parallel in the upper-lower direction D2, and each of them is supported by an elastically deformable leg portion 72. The leg portions 72 extend in the left-right direction D3 so as to be spaced apart from the front retainer substrate receiving portion 73 that are provided in twos, and are each folded in the forward direction D11. Furthermore, as illustrated in FIG. 9, at the end of the leg portion 72, a vertical frame body 71 that extends in parallel along the upper-lower direction D2 is provided to be integrally formed with the leg portion 72. When the substrates W are stored in the substrate storage space 27 and the space is closed by the lid body 3, the front retainer substrate receiving portion 73 sandwiches and supports the substrates W in a state in which the end edge of the edge of each of the substrates W is being biased toward the center of the substrate storage space 27 (the near side of the plane of the page of FIG. 8) owing to the elastic force of the leg portion 72.

More specifically, as illustrated in FIG. 12, the front retainer substrate receiving portion 73 includes a lower side inclined face 731 and an upper side inclined face 732.

The lower side inclined face 731 abuts an end edge of the back side (a lower face) of the substrate W, while the container main body opening portion 21 is closed by the lid body 3. The upper side inclined face 732 abuts the end edge of the front face (an upper face) of the substrate W. More specifically, the lower side inclined face 731 is configured by an inclined face that extends in an inclined manner so as to be spaced apart from the center of the substrate storage space 27 in the forward-backward direction D1 (the left side in FIG. 12) as advancing in the upper direction D21. The upper side inclined face 732 is configured by an inclined face that extends in an inclined manner so as to approach the center of the substrate storage space 27 in the forward-backward direction D1 as advancing in the upper direction D21. The lower side inclined face 731 and the upper side inclined face 732 form a V-shaped groove as a recessed groove that is dented so as to be spaced apart from the center of the substrate storage space 27. While the container main body opening portion 21 is closed by the lid body 3, the end edge of the back face of the substrate W and the end edge of the front face of the substrate W respectively abut the lower side inclined face 731 and the upper side inclined face 732.

Furthermore, the front retainer 7 is provided with a casting-off portion 75. As illustrated in FIG. 10, etc., the casting-off portion 75 includes a plate spring-like portions 751 and a casting-off portion vertical frame bodies 753. As illustrated in FIG. 8, the plate spring-like portions 751 are provided in twos to be spaced apart at a predetermined interval in the left-right direction D3 so as to form a pair, and are separated from the leg portions 72 at a predetermined distance in the forward-backward direction D1 to have a positional relationship overlapping with the leg portions 72, as illustrated in FIG. 11, etc. The plate spring-like portions 751 that are provided in twos so as to form pairs are provided in a state in which twenty-five pieces of the pairs are arranged in parallel in the upper-lower direction D2. Triangle notches 754 in a triangular shape are formed at the ends facing each other in the left-right direction D3. This makes it possible for the ends to be elastically deformed significantly. As illustrated in FIG. 8, the plate spring-like portions 751 extend so as to be spaced apart from each other in the left-right direction D3, and are each folded in the forward direction D11. Furthermore, at the end of the plate spring-like portion 751, as illustrated in FIG. 10, the casting-off portion vertical frame bodies 753 extending in parallel in the upper-lower direction D2 is provided to be integrally formed with the plate spring-like portion 751. The casting-off portion vertical frame bodies 753 is fixed, together with the vertical frame body 71, to a portion of the lid body main body 30 which forms the recessed portion 34. With this configuration, the front retainer 7 is fixed to the lid body main body 30.

In order for the maximum static friction coefficient in a case in which the plate spring-like portion 751 constituting the casting-off portion 75 is slid with respect to the substrate W to be relatively lower than any of the maximum static friction coefficients in a case in which the lower side inclined face 731 and the upper side inclined face 732 of the front retainer substrate receiving portion 73 is slid with respect to the substrate W, the plate spring-like portion 751, the lower side inclined face 731, and the upper side inclined face 732 are subjected to surface processing such as surface roughening, as appropriate. More specifically, the maximum static friction coefficient in a case in which the plate spring-like portion 751 is slid with respect to the substrate W is 0.25 or less. The reason to set the value of the maximum static friction coefficient to be 0.25 or less is that, in a case of exceeding 0.25, the substrate W does not slide sufficiently with respect to the plate spring-like portion 751. Furthermore, the maximum static friction coefficients in a case in which the lower side inclined face 731 and the upper side inclined face 732 are slid with respect to the substrate W are 0.3 or more. The reason to set the value of the maximum static friction coefficient to be 0.3 or more is that, in a case of being 0.3 or less, it is likely that contaminants will deposit on clean substrates W due to the generation of particles caused by the vibration, etc., during the transportation of the substrate storing container 1.

Figure 13:
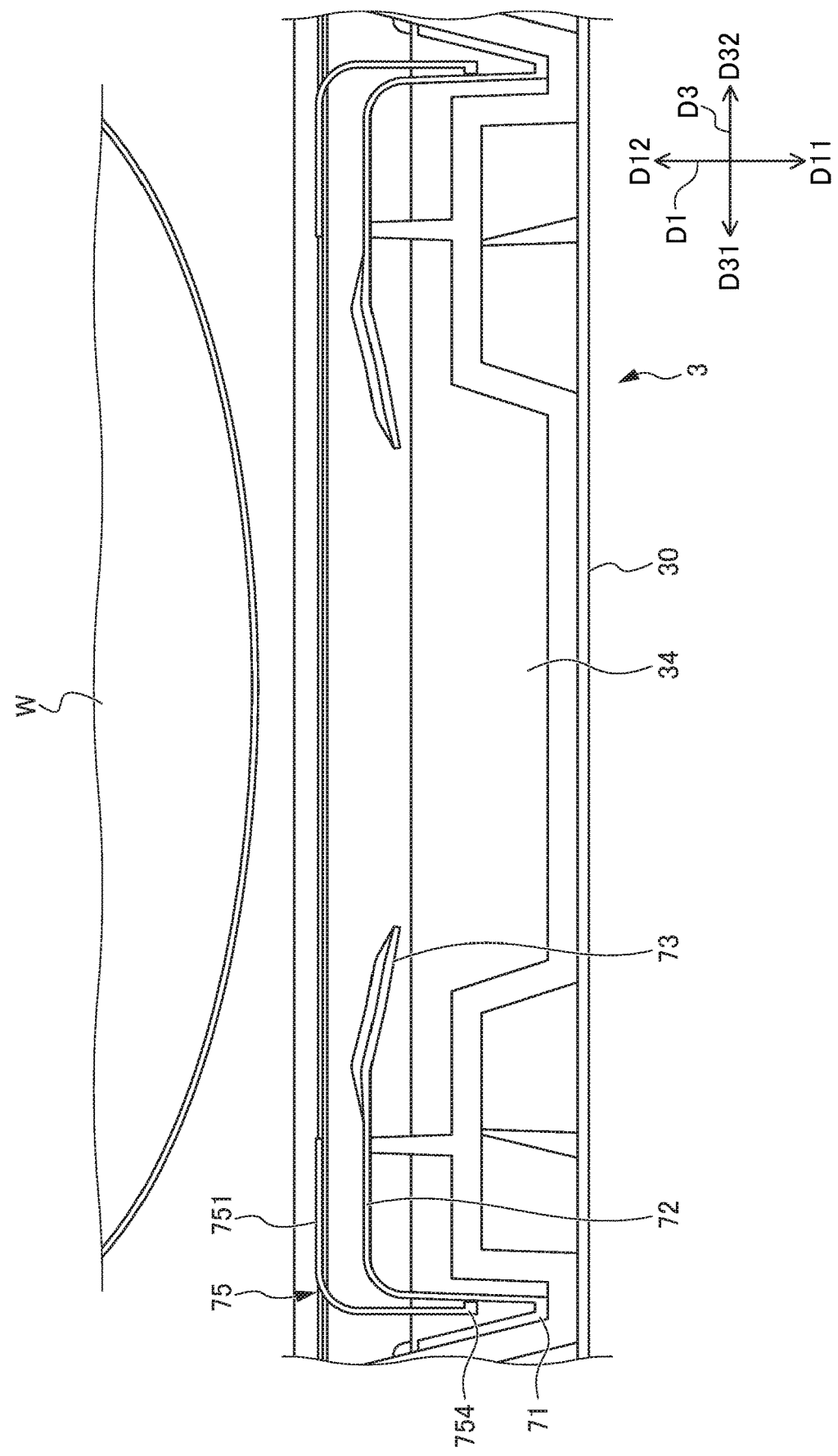
FIG. 13 is an enlarged cross-sectional view of a state in which a casting-off portion 75 does not abut the substrate W and thus is away from the substrate W, in the lid body 3 of the substrate storing container 1 according to the first embodiment of the present invention.

Next, operations upon storing the substrates W in the substrate storage space 27, closing the container main body opening portion 21 by the lid body 3, and thereafter, removing the lid body 3 in the above-described substrate storing container 1 will be described. FIG. 13 is an enlarged cross-sectional view of a state in which the casting-off portion 75 does not abut the substrate W and thus is away from the substrate W in the lid body 3 of the substrate storing container 1 according to the first embodiment of the present invention. FIG. 14 is an enlarged cross-sectional view of a state in which the casting-off portion 75 starts to abut the substrate W in the lid body 3 of the substrate storing container 1 according to the first embodiment of the present invention. FIG. 15 is an enlarged cross-sectional view of a state of the casting-off portion 75 in the lid body 3, when the container main body opening portion 21 is closed by the lid body 3, in the substrate storing container 1 according to the first embodiment of the present invention.

First, while the substrate W is stored in the substrate storage space 27, the substrate W is supported by being sandwiched between the back side substrate support portion 6 and the front retainer 7 which cooperate with each other. Therefore, the edge portion of the substrate W is engaged with the recessed portion 82 of the recessed portion forming portion 81 via the opening that is formed between the lower side abutting face 841 and the upper side inclined face 851. Furthermore, the edge portion of the substrate W abuts an edge portion (not illustrated) of the casting-off portion 83, which forms the opening, in the left-right direction D3 in the rear pressing portion 80. Furthermore, with the substrate W, the casting-off portion 83 is pressed in the backward direction D12 by the elastic force of the leg portion 72 of the front retainer 7, and thus, pressed against the rib-like portion 221. Since the elastic force of the leg portion 72 of the front retainer 7 is stronger than the elastic force of the plate spring portion 832, as illustrated in FIG. 5, the casting-off portion 83 is pressed against the rib-like portion 221.

Furthermore, as illustrated in FIG. 15, in the front retainer 7, the front retainer substrate receiving portion 73 abuts the edge portion of the substrate W and supports the substrate W in a state in which the substrate W is biased in the backward direction, and furthermore, the plate spring-like portion 751 abuts the edge portion of the substrate W so that the substrate W is biased in the backward direction.

Next, in a case in which the manipulating portion 33 of the lid body 3 (refer to FIG. 1, etc.) is manipulated, and the engagement of the latch engaging recessed portions 241A and 241B of the container main body 2 with the upper side latch portion 32A and the lower side latch portion 32B is released, as illustrated in FIG. 4, in the rear pressing portion 80, the casting-off portion 83 is moved in the forward direction D11 with respect to the rib-like portion 221 by the elastic force of the plate spring portion 832, thereby producing a gap G between the rib-like portion 221 and the casting-off portion 83. Along with this manipulation, the substrate W is casted off in the forward direction D11 by the casting-off portion 83, and the engagement of the edge portion of the substrate W with the recessed portion 82 of the rib-like portion 221 is released. With such a configuration, as illustrated in FIG. 6, the edge portion of the substrate W slides on the lower side inclined face 842 and then slides down, so that the lower face of the substrate W abuts the lower side abutting face 841, a result of which the substrate W is provided at a predetermined location thus abutted (a predetermined location at which the substrate W is handled by a predetermined device). Furthermore, as illustrated in FIG. 3, the substrate W is supported by a predetermined device (not illustrated), and taken out from the substrate storage space 27.

Furthermore, in the front retainer 7, as illustrated in FIG. 14, the substrate W is pressed by the elastic force of the leg portion 72 in the backward direction D12, and furthermore, aside from this, the substrate W is pressed by the elastic force of the plate spring-like portion 751 in the backward direction D12. Furthermore, the substrate W is taken out from the front retainer substrate receiving portion 73 by the elastic force of the plate spring-like portion 751, and the substrate W is arranged at a predetermined location (predetermined location at which the substrate W is handled by a predetermined device). Furthermore, as illustrated in FIG. 13, the substrate W is supported by a predetermined device (not illustrated), and taken out from the substrate storage space 27.

According to the substrate storing container 1 according to the first embodiment of the above-described configuration, the following effects can be obtained. As described above, the substrate storing container includes: a container main body 2 including an opening circumferential portion 28 at one end thereof where a container main body opening portion 21 is formed, and including a tubular wall portion 20 having another end thereof which is closed, in which a substrate storage space 27 is formed which can store a plurality of substrates W by an inner face of the wall portion, and is in communication with the container main body opening portion 21; the lid body 3 that is attachable to and detachable from the container main body opening portion 21 and can close the container main body opening portion 21; the substrate support plate-like portion 5 as a lateral substrate support portion that is provided to form a pair in the substrate storage space 27 and, while the container main body opening portion 21 is not closed by the lid body 3, can support edge portions of the plurality of substrates W in a state in which adjacent substrates W among the plurality of substrates W are spaced apart by a predetermined interval and arranged in parallel to each other; the front retainer 7 as a lid body side substrate support portion that, while the container main body opening portion 21 is closed by the lid body, is disposed at a portion of the lid body 3 that faces the substrate storage space 27 and can support the edge portions of the plurality of substrates W; the back side substrate support portion 6 that is provided to form a pair with the front retainer 7 in the substrate storage space 27 and can support the edge portions of the plurality of substrates W and, while the container main body opening portion 21 is closed by the lid body 3, cooperates with the front retainer 7 to be able to support the plurality of substrates W; and the casting-off portions 75, 83 that cast off the substrates W in a state being supported by the back side substrate support portion 6 and the front retainer 7 from the back side substrate support portion and the front retainer 7, respectively, when the lid body 3 is opened from the container main body opening portion 21 from a state in which the container main body opening portion 21 is closed by the lid body 3.

With such a configuration described above, in a case in which a physical pressure to press the substrate W against the back side substrate support portion 6 and the front retainer 7 weakened, upon opening the container main body opening portion 21 by way of the lid body 3, by casting off the substrate W by the casting-off portions 75 and 83, it is possible to support the substrate W by a predetermined device and move the substrate W to a predetermined location at which the substrate W can be taken out from the container main body. As a result of this, it is possible to take the substrate W out reliably from the container main body 2 by using a predetermined device.

Furthermore, the maximum static friction coefficient of the portion of the casting-off portion 83 that abuts the substrate W upon closing and opening the container main body opening portion 21 by way of the lid body 3 is smaller than that of the portion of the back side substrate support 6 that abuts the substrate W.

Furthermore, the maximum static friction coefficient of the portion of the casting-off portion 75 that abuts the substrate W upon closing and opening the container main body opening portion 21 by way of the lid body 3 is smaller than that of the portion of the front retainer 7 that abuts the substrate W.

With such a configuration, since the maximum static friction coefficient of the portion of the casting-off portion 83 that abuts the substrate W is smaller than that of the portion of the back side substrate support 6 that abuts the substrate W, and since the maximum static friction coefficient of the portion of the casting-off portion 75 that abuts the substrate W is smaller than that of the portion of the front retainer 7 that abuts the substrate W, it is possible to smoothly move the substrate W with respect to the portions of the casting-off portions 75 and 83. As a result of this, it is possible to reliably move the substrate W to a predetermined location.

On the contrary, since the maximum static friction coefficients of the portion of the back side substrate support portion 6 and the front retainer 7 that each abut the substrate W when the container main body opening portion 21 is closed by the lid body 3 is larger than that of the portions of the casting-off portions 83 and 75 that abut the substrate W, it is possible to suppress contaminants due to the generation of particles, etc., and to maintain the substrate storage space 27 in a clean state, thereby making it possible to store the substrate W in a clean state. In other words, it is possible to achieve both the storage of the substrate W in a clean state and the movement of the substrate W to a predetermined location when taking the substrate W out from the container main body 2.

Furthermore, the casting-off portion 75 includes the plate spring-like portion 751 as an elastic member which is elastically deformed, and casts off the substrate W by the elastic force of the plate spring-like portion 751. Furthermore, the casting-off portion 83 includes the plate spring portion 832 as an elastic member which is elastically deformed, and casts off the substrate W by the elastic force of the plate spring portion 832. With such a configuration, it is possible for the casting-off portions 75 and 83 to reliably cast off the substrate W.

Figure 16A:
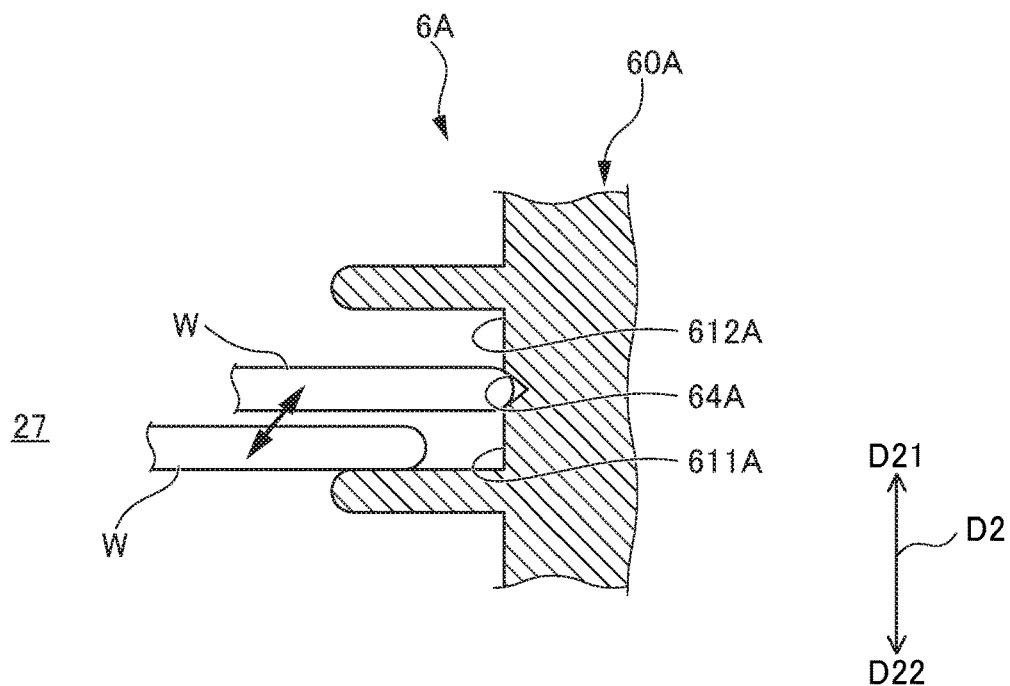
FIG. 16A is a schematic diagram illustrating a positional relationship of a substrate W with respect to a back side end edge support portion 60A when a container main body opening portion 21 is opened and closed by the lid body 3, in a substrate storing container according to a second embodiment of the present invention.
Figure 16B:
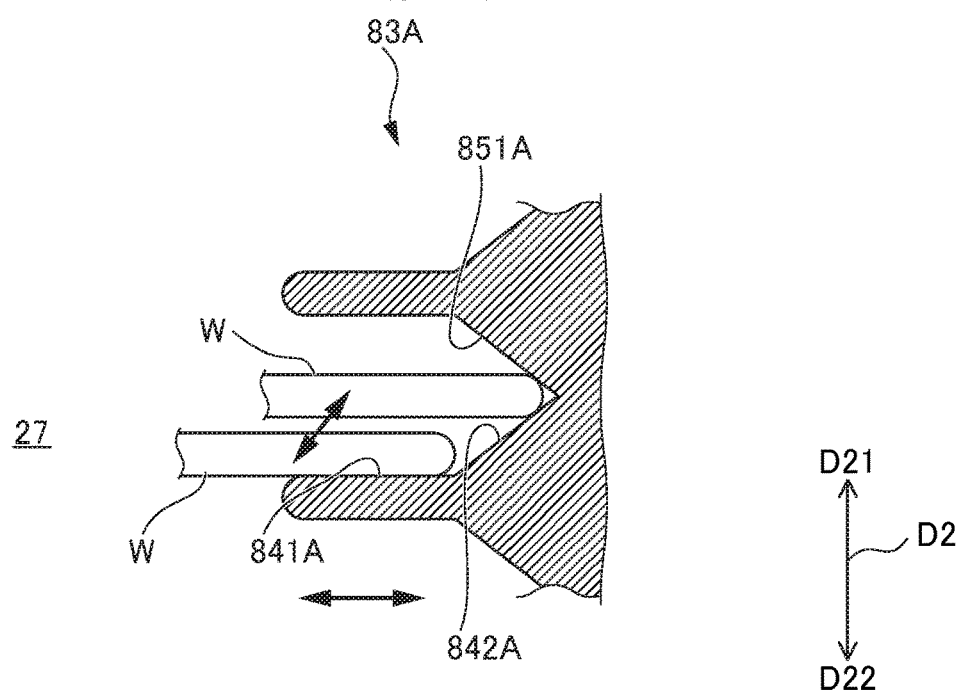
FIG. 16B is a schematic diagram illustrating a positional relationship of the substrate W with respect to a casting-off portion 83A, when the container main body opening portion 21 is opened and closed by the lid body 3, in the substrate storing container according to the second embodiment of the present invention.

Next, a substrate storing container according to a second embodiment will be described with reference to the drawings. FIG. 16A is a schematic diagram illustrating a positional relationship of the substrate W with respect to a back side end edge support portion 60A, when a container main body opening portion 21 is opened and closed by the lid body 3, in a substrate storing container according to a second embodiment of the present invention. FIG. 16B is a schematic diagram illustrating a positional relationship of the substrate W with respect to a casting-off portion 83A, when the container main body opening portion 21 is opened and closed by the lid body 3, in the substrate storing container according to the second embodiment of the present invention.

The second embodiment differs from the first embodiment in that the back side substrate support portion 6A is integrally formed with the substrate support plate-like portion 5 (refer to FIG. 2, etc.) and the second embodiment includes a casting-off portion 83A in place of the configuration including the casting-off portion 83 and the rib-like portion 221 that supports an edge portion of the substrate W. The second embodiment is the same as the first embodiment except for the configuration described above. Therefore, the same members are illustrated with the same reference numerals, and the descriptions thereof will be omitted.

The back side substrate support portion 6A (refer to FIG. 16A) is provided to be integrally formed with the substrate support plate-like portion 5 (refer to FIG. 2 etc.) at the rear side of the substrate support plate-like portion 5. The back side substrate support portion 6A is provided at the wall portion 20 (refer to FIG. 2, etc.) so as to form a pair with a front retainer 7 (refer to FIG. 7, etc.) within the substrate storage space 27. When the container main body opening portion 21 is closed by the lid body 3, the back side substrate support portion 6A abuts the edge portion of each of the plurality of substrates W, thereby making it possible to support rear portions of the edge portions of the plurality of substrates W. In other words, when the container main body opening portion 21 is closed by the lid body 3, the back side substrate support portion 6A supports the plurality of substrates W in cooperation with the front retainer 7, thereby retaining the plurality of substrates W in a state in which adjacent substrates W are spaced apart by a predetermined interval and arranged in parallel to each other.

As illustrated in FIG. 16A, the back side substrate support portion 6A includes the back side end edge support portion 60A. The back side end edge support portion 60A is integrally formed with the plate portion 51 and the support wall 52 at a rear end portion of the plate portion 51 of the substrate support plate-like portion 5 (refer to FIG. 2, etc.).

More specifically, the twenty-five back side end edge support portions 60A are provided so as to correspond to each of the substrates W that can be stored in the substrate storage space 27. The back side end edge support portion 60A arranged at the first side wall 25 and the second side wall 26 has a positional relationship forming a pair with the front retainer 7 in the forward-backward direction D1 as described later.

The back side end edge support portion 60A includes a lower side face 611A and an upper side face 612A, and a substrate engaging groove 64A is formed between them. When the container main body opening portion 21 is closed by the lid body 3, the substrate W slides on the lower side face 611A to thereby be elevated, and when the substrate W reaches the position of the substrate engaging groove 64A, the end of the substrate W is supported by the back side end edge support portion 60A at the substrate engaging groove 64A.

As illustrated in FIG. 16B, the casting-off portion 83A includes a lower side abutting face 841A, a lower side inclined face 842A, and an upper side inclined face 851A.

More specifically, when the container main body opening portion 21 is closed by the lid body 3, the lower side abutting face 841A abuts an end edge of the back face (a lower face) of the substrate W to support the substrate W. The lower side inclined face 842A is configured by an inclined face that extends in an inclined manner from the end of the lower side abutting face 841A so as to be spaced apart from the center of the substrate storage space 27 (the left side in FIG. 16B) as advancing in the upper direction D21, and the end of the back side of the substrate W is slid. The upper side inclined face 851A is configured by an inclined face that extends in an inclined manner from an upper end of the lower side inclined face 842A so as to approach the center of the substrate storage space 27 (the left side in FIG. 16B) as advancing in the upper direction D21.

The lower side inclined face 842A and the upper side inclined face 851A are provided on an upper side of the lower side abutting face 841A, and forms a V-shaped groove which is a dented recessed groove so as to be spaced apart from the center of the substrate storage space 27 with which the end of the substrate W can be engaged. While the container main body opening portion 21 is closed by the lid body 3, the substrate W slides on the lower side inclined face 842A to thereby be elevated, and when the substrate W reaches the location of the apex of the V-shaped groove, the end of the substrate W is supported at the V-shaped groove.

So that any of the maximum static friction coefficients in a case of sliding the lower side abutting face 841A, the lower side inclined face 842A, or the upper side inclined face 851A with respect to the substrate W to be relatively lower than the maximum static friction coefficient in a case of sliding the back side end edge support portion 60A with respect to the substrate W, the lower side inclined face 842A, the lower side abutting face 841A, the back side end edge support portion 60A, and the upper side inclined face 851A are subjected to surface processing such as surface roughening, as appropriate. Similarly to the first embodiment, the casting-off portion 83A is biased in the forward direction D11 by a plate spring portion (not illustrated). More specifically, the maximum static friction coefficients in a case in which the lower side abutting face 841A, the lower side inclined face 842A, and the upper side inclined face 851A are slid with respect to the substrate W are 0.25 or less. The reason to set the value of the maximum static friction coefficient to be 0.25 or less is that, in a case of exceeding 0.25, the substrate W does not slide sufficiently with respect to the lower side abutting face 841A, the lower side inclined face 842A, and the upper side inclined face 851A. Furthermore, the maximum static friction coefficient in a case in which the back side end edge support portion 60A is slid with respect to the substrate W is 0.3 or more. The reason to set the value of the maximum static friction coefficient to be 0.3 or more is that, in a case of being 0.3 or less, it is likely that contaminants will deposit on clean substrates W due to the generation of particles caused by the vibration, etc., during the transportation of the substrate storing container 1.

Next, operations upon storing the substrates W in the substrate storage space 27, closing the container main body opening portion 21 by the lid body 3, and thereafter, removing the lid body 3 will be described. The configuration in which, while the container main body opening portion 21 is closed by the lid body 3 and the substrate W is stored in the substrate storage space 27, the substrate W is supported by being sandwiched between the back side substrate support portion 6A and the front retainer 7 which cooperate with each other, is similar to that of the first embodiment. Therefore, as illustrated in FIG. 16A, the edge portion of the substrate W is engaged with the substrate engaging groove 64A of the back side end edge support portion 60A, whereby the edge portion of the substrate W is supported by the back side end edge support portion 60A. Furthermore, at this time, as illustrated in FIG. 16B, at the casting-off portion 83A, the lower side inclined face 842A abuts an edge portion of the lower face of the substrate W, and the upper side inclined face 851A abuts an edge portion of the upper face of the substrate W.

Next, when the manipulation portion 33 of the lid body 3 is manipulated, and the engagement of the latch engaging recessed portion 241A of the container main body 2 with the upper side latch portion 32A and the engagement of the latch engaging recessed portion 241B of the container main body 2 with the lower side latch portion 32B are released, the casting-off portion 83A moves in the forward direction D11 with respect to the container main body 2 by the elastic force of the plate spring portion (not illustrated) and, along with this manipulation, the substrate W is casted off by the casting-off portion 83A in the forward direction D11, and the engagement of the back side end edge support portion 60A with the substrate engaging groove 64A is released. With such a configuration, as illustrated in FIG. 16B, the edge portion of the substrate W slides on the lower side inclined face 842A and then slides down, so that the lower face of the substrate W abuts the lower side abutting face 841A, a result of which the substrate W is provided at a predetermined location thus abutted in this way. Furthermore, the substrate W is supported by a predetermined device, and taken out from the substrate storage space 27.

Figure 17A:
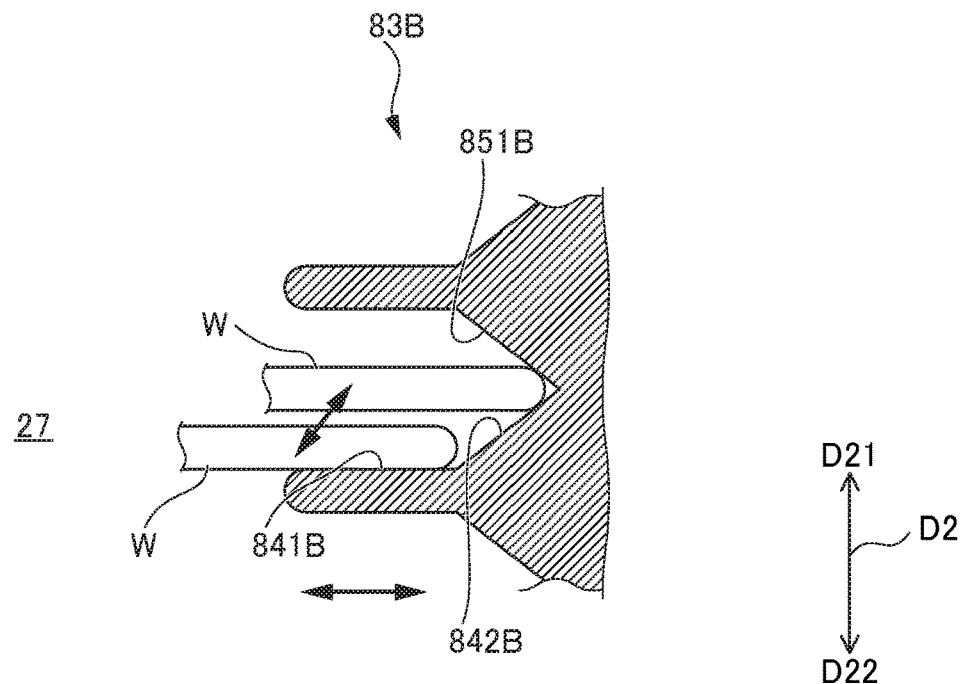
FIG. 17A is a schematic diagram illustrating a positional relationship of a substrate W with respect to a casting-off portion 83B, when a container main body opening portion 21 is opened and closed by a lid body 3, in a substrate storing container according to a third embodiment of the present invention.
Figure 17B:
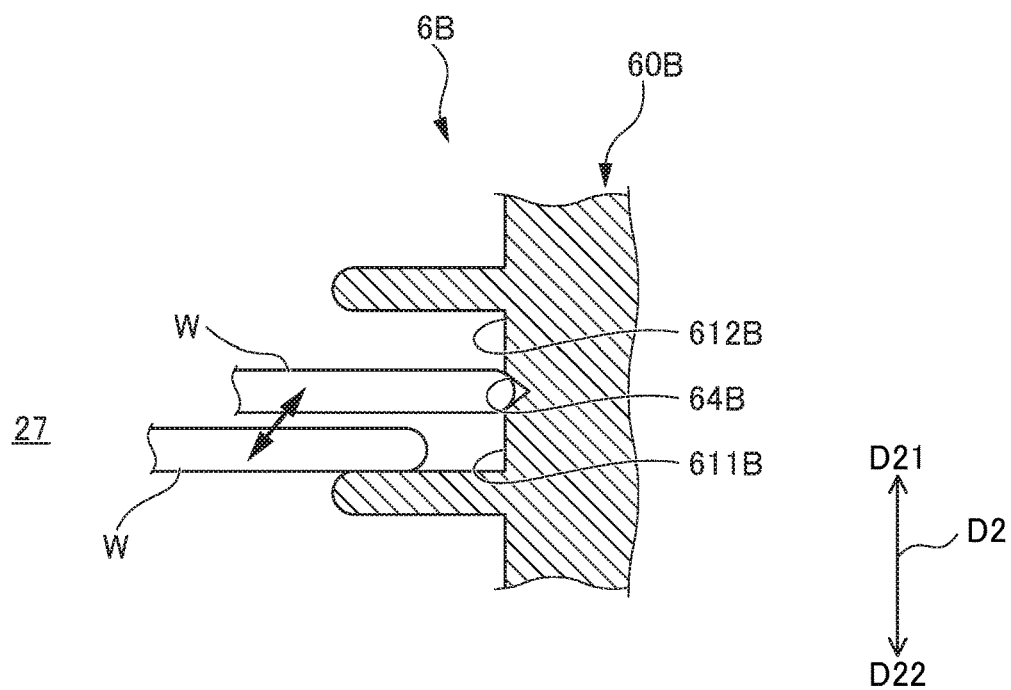
FIG. 17B is a schematic diagram illustrating a positional relationship of the substrate W with respect to a back side end edge support portion 60B when the container main body opening portion 21 is opened and closed by the lid body 3, in the substrate storing container according to the third embodiment of the present invention.

Next, a substrate storing container according to a third embodiment will be described with reference to the drawings. FIG. 17A is a schematic diagram illustrating a positional relationship of the substrate W with respect to a casting-off portion 83B, when a container main body opening portion 21 is opened and closed by a lid body 3, in a substrate storing container according to a third embodiment of the present invention. FIG. 17B is a schematic diagram illustrating a positional relationship of the substrate W with respect to a back side end edge support portion 60B, when the container main body opening portion 21 is opened and closed by the lid body 3, in the substrate storing container according to the third embodiment of the present invention.

The third embodiment differs from the second embodiment in that the casting-off portion 83A with a similar configuration to that of the second embodiment is provided at a rear portion of the substrate support plate-like portion 5, and the back side substrate support portion 6A with a similar configuration to that of the second embodiment is provided at the rib-like portion 221. Regarding the configuration of the casting-off portion 83B in the third embodiment which corresponds to the configuration of the casting-off portion 83A, the reference symbol A in the second embodiment is replaced with the reference symbol B in the third embodiment for illustration, and the explanations thereof are omitted. Similarly, regarding the configuration of the back side substrate support portion 6B in the third embodiment which corresponds to the configuration of the back side substrate support portion 6A in the second embodiment, the reference symbol A in the second embodiment is replaced with the reference symbol B in the third embodiment for illustration, and the explanations thereof are omitted. The third embodiment is the same as the first embodiment except for the configuration described above. Therefore, the same members are illustrated with the same reference numerals, and the descriptions thereof will be omitted.

So that any of the maximum static friction coefficients in a case of sliding the lower side abutting face 841B, the lower side inclined face 842B, or the upper side inclined face 851B with respect to the substrate W to be relatively lower than the maximum static friction coefficient in a case of sliding the back side end edge support portion 60B with respect to the substrate W, the lower side inclined face 842B, the lower side abutting face 841B, the back side end edge support portion 60B, and the upper side inclined face 851B are subjected to surface processing such as surface roughening, as appropriate. More specifically, the maximum static friction coefficients in a case in which the lower side abutting face 841B, the lower side inclined face 842B, and the upper side inclined face 851B are slid with respect to the substrate W are 0.25 or less. The reason to set the value of the maximum static friction coefficient to be 0.25 or less is that, in a case of exceeding 0.25, the substrate W does not slide sufficiently with respect to the lower side abutting face 841B, the lower side inclined face 842B, and the upper side inclined face 851B. Furthermore, the maximum static friction coefficient in a case in which the back side end edge support portion 60B is slid with respect to the substrate W is 0.3 or more. The reason to set the value of the maximum static friction coefficient to be 0.3 or more is that, in a case of being 0.3 or less, it is likely that contaminants will deposit on clean substrates W due to the generation of particles caused by the vibration, etc., during the transportation of the substrate storing container 1.

Next, operations upon storing the substrates W in the substrate storage space 27, closing the container main body opening portion 21 by the lid body 3, and thereafter, removing the lid body 3 will be described. The configuration in which, while the container main body opening portion 21 is closed by the lid body 3 and the substrate W is stored in the substrate storage space 27, the substrate W is supported by being sandwiched between the back side substrate support portion 6 and the front retainer 7 which cooperate with each other, is similar to these of the first embodiment and the second. Therefore, as illustrated in FIG. 17B, the edge portion of the substrate W is engaged with the substrate engaging groove 64B of the back side end edge support portion 60B, whereby the edge portion of the substrate W is supported by the back side end edge support portion 60B. Furthermore, at this time, at the casting-off portion 83B provided at the rear portion of the substrate support plate-like portion 5, the lower side inclined face 842B abuts an edge portion of the lower face of the substrate W, and the upper side inclined face 851B abuts an edge portion of the upper face of the substrate W.

Next, when the manipulation portion 33 of the lid body 3 is manipulated, and the engagement of the latch engaging recessed portion 241A of the container main body 2 with the upper side latch portion 32A and the engagement of the latch engaging recessed portion 241B of the container main body 2 with the lower side latch portion 32B are released, the casting-off portion 83B moves in the forward direction D11 with respect to the container main body 2 by the elastic force of the plate spring portion (not illustrated) and, along with this manipulation, the substrate W is casted off by the casting-off portion 83B in the forward direction D11, and the engagement of the back side end edge support portion 60B with the substrate engaging groove 64B is released. With such a configuration, as illustrated in FIG. 17A, at the casting-off portion 83B, the edge portion of the substrate W slides on the lower side inclined face 842B and then slides down, so that the lower face of the substrate W abuts the lower side abutting face 841B, a result of which the substrate W is provided at a predetermined location thus abutted in this way. Furthermore, the substrate W is supported by a predetermined device, and taken out from the substrate storage space 27.

Figure 18:
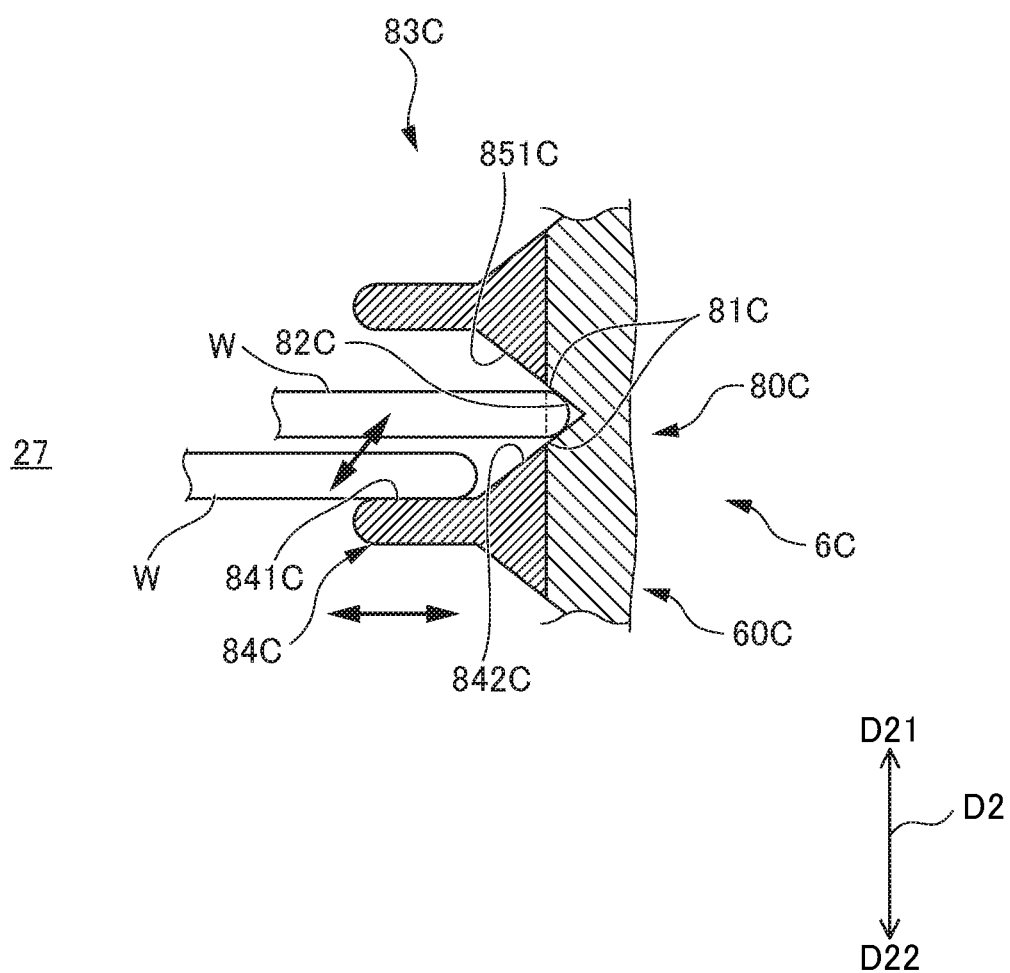
FIG. 18 is a schematic diagram illustrating a positional relationship of a substrate W with respect to a back side end edge support portion 60 and a casting-off portion 83C, when a container main body opening portion 21 is opened and closed by a lid body 3, in the substrate storing container according to a fourth embodiment of the present invention.

Next, a substrate storing container according to a fourth embodiment will be described with reference to the drawings. FIG. 18 is a schematic diagram illustrating a positional relationship of a substrate W with respect to a back side end edge support portion 60 and a casting-off portion 83C, when a container main body opening portion 21 is opened and closed by a lid body 3, in the substrate storing container according to the fourth embodiment of the present invention.

The fourth embodiment differs from the first embodiment in that a back side substrate support portion 6C is provided to be integrally formed with the substrate support plate-like portion 5, the casting-off portion 83C with a similar configuration to that of the first embodiment is provided at a rear portion of the substrate support plate-like portion 5, and a rear retainer is provided which abuts the substrate W only when a strong impact is applied to the container main body 2 and is in non-contact with the substrate W when a strong impact is not applied to the container main body 2. Regarding the configuration of the casting-off portion 83C in the fourth embodiment which corresponds to the configuration of the casting-off portion 83 in the first embodiment, the reference number in the first embodiment is added the reference symbol C in the fourth embodiment for illustration, and the explanations thereof are omitted. Similarly, regarding the configuration of the back side substrate support portion 6C in the fourth embodiment which corresponds to the configuration of the back side substrate support portion 6 in the first embodiment, the reference numeral in the first embodiment is added the reference symbol C in the third embodiment for illustration, and the explanations thereof are omitted.

At the rear portion of the substrate support plate-like portion 5, a back side end edge support portion 60C is provided which has a shape similar to the shape of the rib-like portion 221 of the first embodiment, i.e., a shape including a recessed portion forming portion 81C in which a recessed portion 82C is formed at a predetermined interval in the upper-lower direction D2. Furthermore, the casting-off portion 83C similar to the casting-off portion 83 of the first embodiment is provided on the front side of the back side end edge support portion 60C.

So that any of the maximum static friction coefficients in a case of sliding the lower side abutting face 841C, the lower side inclined face 842C, or the upper side inclined face 851C with respect to the substrate W to be relatively lower than the maximum static friction coefficient in a case of sliding the back side end edge support portion 60C with respect to the substrate W, the lower side inclined face 842C, the lower side abutting face 841C, the back side end edge support portion 60C, and the upper side inclined face 851C are subjected to surface processing such as surface roughening, as appropriate. More specifically, the maximum static friction coefficients in a case in which the lower side abutting face 841C, the lower side inclined face 842C, and the upper side inclined face 851C are slid with respect to the substrate W are 0.25 or less. The reason to set the value of the maximum static friction coefficient to be 0.25 or less is that, in a case of exceeding 0.25, the substrate W does not slide sufficiently with respect to the lower side abutting face 841C, the lower side inclined face 842C, and the upper side inclined face 851C. Furthermore, the maximum static friction coefficient in a case in which the back side end edge support portion 60C is slid with respect to the substrate W is 0.3 or more. The reason to set the value of the maximum static friction coefficient to be 0.3 or more is that, in a case of being 0.3 or less, it is likely that contaminants are deposited on clean substrates W due to the generation of particles caused by the vibration, etc., during the transportation of the substrate storing container 1.

The rear retainer (not illustrated) is provided at the rib-like portion 221, and the V-shaped grooves into which the edge portions of twenty-five pieces of substrates W can be inserted are formed at the rib-like portion 221. The portion of the rib-like portion 221 where the V-shaped groove is formed is spaced apart at a predetermined distance from the edge portion of the substrate W when the substrate W is stored in the substrate storage space 27 and the container main body opening portion 21 is closed by the lid body 3. The portion of the rib-like portion 221 abuts the substrate W when a strong impact is applied to the container main body 2, thereby suppressing the distortion of the substrate W by a predetermined amount or more.

Next, operations upon storing the substrates W in the substrate storage space 27, closing the container main body opening portion 21 by the lid body 3, and thereafter, removing the lid body 3 will be described. The configuration in which, while the container main body opening portion 21 is closed by the lid body 3 and the substrate W is stored in the substrate storage space 27, the substrate W is supported by being sandwiched between the back side substrate support portion 6 and the front retainer 7 which cooperate with each other, is similar to these of the first embodiment to the third embodiment. Therefore, as illustrated in FIG. 18, the edge portion of the substrate W is engaged with the recessed portion 82C of the recessed portion forming portion 81C, whereby the edge portion of the substrate W is supported by the back side end edge support portion 60C. Furthermore, at this time, at the casting-off portion 83C provided at the rear portion of the substrate support plate-like portion 5, the lower side inclined face 842C abuts an edge portion of the lower face of the substrate W, and the upper side inclined face 851C abuts an edge portion of the upper face of the substrate W.

Next, when the manipulation portion 33 of the lid body 3 is manipulated, and the engagement of the latch engaging recessed portion 241A of the container main body 2 with the upper side latch portion 32A and the engagement of the latch engaging recessed portion 241B of the container main body 2 with the lower side latch portion 32B are released, the casting-off portion 83C moves in the forward direction D11 with respect to the container main body 2 by the elastic force of the plate spring portion 832 and, along with this manipulation, the substrate W is casted off by the casting-off portion 83C in the forward direction D11, and the engagement of the recessed portion forming portion 81C with the recessed portion 82C is released. With such a configuration, as illustrated in FIG. 18, the edge portion of the substrate W slides on the lower side inclined face 842C and then slides down, so that the lower face of the substrate W abuts the lower side abutting face 841C, a result of which the substrate W is provided at a predetermined location thus abutted in this way. Furthermore, the substrate W is supported by a predetermined device, and taken out from the substrate storage space 27.

The present invention is not limited to the abovementioned embodiments, and modifications thereto within the technical scope recited in the claims are possible.

For example, the casting-off portions 83 and 75 in the present embodiment are provided at both the side of the container main body and the side of the lid body; however, this is non-limitative. It suffices so long as the casting-off portion includes a configuration whereby it is possible to cast off the substrate W from at least one of the back side substrate support portion and the lid body side substrate support portion. Therefore, for example, in the present embodiment, the substrate storing container 1 includes the casting-off portion 83 and the casting-off portion 75. However, the substrate storing container 1 may include the casting-off portion 83 but not include the casting-off portion 75. Furthermore, the plate spring portion 832 of the casting-off portion 83 and the plate spring-like portion 751 of the casting-off portion 75 are used as elastic members; however, the present invention is not limited to them. Furthermore, the shapes of the container main body and the lid body and the number and dimensions of substrates W that can be stored in the container main body are not limited to the shape of the container main body 2 and the lid body 3, and the number and dimensions of the substrates W that can be stored in the container main body 2 according to the present embodiments. In other words, the configurations of the lateral substrate support portion, the lid body side substrate support portion, and the back side substrate support portion are not limited to the configurations of the substrate support plate-like portion 5, the front retainer 7, and the back side substrate support portion 6. Furthermore, the substrate W according to the present embodiment is a silicon wafer having a diameter of 300 mm. However, the present invention is not limited to this value.

EXPLANATION OF REFERENCE NUMERALS

1 substrate storing container
2 container main body
3 lid body
5 substrate support plate-like portion (lateral substrate support portion)
6 back side substrate support portion
7 front retainer (lid body side substrate support portion)
20 wall portion
21 container main body opening portion
27 substrate storage space
28 opening circumferential portion
75 casting-off portion
83 casting-off portion
751 plate spring-like portion
832 plate spring portion
W substrate

The invention claimed is:
1. A substrate storing container comprising:
a container main body including an opening circumferential portion at one end thereof where a container main body opening portion is formed, and including a tubular wall portion having another end thereof which is closed, wherein a substrate storage space is formed which is configured to store a plurality of substrates by an inner face of the wall portion, and is in communication with the container main body opening portion;
a lid body that is attachable to and detachable from the container main body opening portion and is configured to close the container main body opening portion;
a lateral substrate support portion that is provided to form a pair in the substrate storage space and, while the container main body opening portion is not closed by the lid body, is configured to support edge portions of the plurality of substrates in a state in which adjacent substrates among the plurality of substrates are spaced apart by a predetermined interval and arranged in parallel to each other;

a lid body side substrate support portion that, while the container main body opening portion is closed by the lid body, is disposed at a portion of the lid body that faces the substrate storage space and is configured to support the edge portions of the plurality of substrates;

a back side substrate support portion that is provided to form a pair with the lid body side substrate support portion in the substrate storage space and is configured to support the edge portions of the plurality of substrates and, while the container main body opening portion is closed by the lid body, cooperates with the lid body side substrate support portion to be able to support the plurality of substrates; and a casting-off portion that casts off the substrate in a state being supported by the back side substrate support portion and the lid body side substrate support portion from the back side substrate support portion, when the lid body is opened from the container main body opening portion from a state in which the container main body opening portion is closed by the lid body;

wherein the casting-off portion is configured to cast off the substrate in a state being supported by the back side substrate support portion from the back side substrate support portion, and cover a circumference of a portion of the back side substrate support portion where the substrate abuts while the lid body closes the container main body opening portion, a maximum static friction coefficient of a portion of the casting-off portion that abuts the substrate when the container main body opening portion is closed or opened by the lid body is smaller than a maximum static friction coefficient of a portion of the lid body side substrate support portion that abuts the substrate, and while the lid body closes the container main body opening portion, the substrate abuts the portion of the back side substrate support portion which is not covered by the casting-off portion, and while the lid body is opened from a state in which the lid body closes the container main body opening portion, the substrate slides with respect to the portion of the casting-off portion where the substrate abuts.

2. The substrate storing container according to claim 1, wherein the casting-off portion casts off the substrate from the lid body side substrate support portion, and wherein a maximum static friction coefficient of a portion of the casting-off portion that abuts the substrate when the container main body opening portion is closed or opened by the lid body is smaller than a maximum static friction coefficient of a portion of the lid body side substrate support portion that abuts the substrate.

3. The substrate storing container according to claim 1, wherein the casting-off portion includes an elastic member that elastically deforms, and casts off the substrate by an elastic force of the elastic member.

\* \* \* \* \*